US012644772B2

(12) United States Patent
Tambo et al.

(10) Patent No.: US 12,644,772 B2
(45) Date of Patent: Jun. 2, 2026

(54) INFRARED SENSOR, SENSING SYSTEM, AND INFRARED SENSING METHOD

(71) Applicant: Panasonic Intellectual Property Management Co., Ltd., Osaka (JP)

(72) Inventors: Naoki Tambo, Kyoto (JP); Kunihiko Nakamura, Osaka (JP); Masaki Fujikane, Osaka (JP); Hiroyuki Tanaka, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 180 days.

(21) Appl. No.: 18/641,274

(22) Filed: Apr. 19, 2024

(65) Prior Publication Data

US 2024/0264004 A1     Aug. 8, 2024

Related U.S. Application Data

(63) Continuation of application No. PCT/JP2022/038377, filed on Oct. 14, 2022.

(30) Foreign Application Priority Data

Nov. 17, 2021     (JP) ................................. 2021-187386

(51) Int. Cl.
*G01J 5/22* (2006.01)
*G01J 5/48* (2022.01)
(Continued)

(52) U.S. Cl.
CPC . *G01J 5/22* (2013.01); *G01J 5/48* (2013.01); *H10N 19/00* (2023.02); *G01J 2005/202* (2013.01)

(58) Field of Classification Search
CPC .............. G01J 5/22; G01J 5/48; H10N 19/00
See application file for complete search history.

(56) References Cited

U.S. PATENT DOCUMENTS 5,952,659 A * 9/1999 Yoneyama ................ G01J 5/20
                                                        250/370.08
10,868,979 B1 * 12/2020 Boesch ................. G01J 5/0846
(Continued)

FOREIGN PATENT DOCUMENTS

JP        2001-309122        11/2001
JP        2017-223644        12/2017
(Continued)

OTHER PUBLICATIONS

International Search Report of PCT application No. PCT/JP2022/038377 dated Dec. 13, 2022.
(Continued)

*Primary Examiner* — Hugh Maupin
(74) *Attorney, Agent, or Firm* — Wenderoth, Lind & Ponack, L.L.P.

(57) ABSTRACT

An infrared sensor according to the present disclosure includes an output pixel, and a switcher. The output pixel includes infrared photodetectors. The switcher switches each of the infrared photodetectors between a first state and a second state independently with a predetermined period P. In the first state, the infrared photodetector is able to change in temperature in response to receiving infrared radiation. In the second state, the infrared photodetector is maintained at a predetermined temperature. Switching of the infrared photodetectors from the second state S2 to the first state S1 is executed sequentially in the period P at a predetermined time interval ti. The output pixel includes N infrared pho- (Continued)

todetectors. The time interval ti divided by the period P is greater than or equal to $1/(N+1)$ and less than or equal to $1/(N-1)$.

12 Claims, 11 Drawing Sheets

(51) Int. Cl.
     *H10N 19/00*        (2023.01)
     *G01J 5/20*         (2006.01)

(56)                References Cited

U.S. PATENT DOCUMENTS

| | | | | | |
|---|---|---|---|---|---|
| 2002/0067423 | A1* | 6/2002 | Suzuki | .................. | H04N 25/63 |
| | | | | | 348/370 |
| 2005/0176179 | A1* | 8/2005 | Ikushima | .............. | H10N 15/10 |
| | | | | | 438/125 |
| 2008/0179525 | A1* | 7/2008 | Ikushima | ............. | G01J 5/0245 |
| | | | | | 257/E31.093 |
| 2009/0152465 | A1* | 6/2009 | Dupont | ............... | H04N 25/673 |
| | | | | | 250/338.1 |
| 2009/0262778 | A1* | 10/2009 | Ikushima | ................. | G01J 5/08 |
| | | | | | 374/121 |

| | | | | | |
|---|---|---|---|---|---|
| 2011/0254959 | A1* | 10/2011 | Seppa | ....................... | G01J 5/20 |
| | | | | | 250/338.3 |
| 2013/0218500 | A1* | 8/2013 | Durand | ..................... | G01J 5/22 |
| | | | | | 702/87 |
| 2017/0356806 | A1 | 12/2017 | Takahashi et al. | | |
| 2019/0178718 | A1 | 6/2019 | Kawasaki et al. | | |
| 2020/0191658 | A1 | 6/2020 | Kawasaki et al. | | |
| 2022/0260425 | A1* | 8/2022 | Jacob | ........................ | G01J 5/22 |

FOREIGN PATENT DOCUMENTS

| | | |
|---|---|---|
| JP | 2019-105624 | 6/2019 |
| KR | 2010-110305 | 10/2010 |
| WO | 2009/065586 | 5/2009 |
| WO | 2011/139320 | 11/2011 |
| WO | 2011/139329 | 11/2011 |
| WO | 2013/011753 | 1/2013 |
| WO | 2008/044578 | 4/2018 |
| WO | 2018/190933 | 10/2018 |

OTHER PUBLICATIONS

Office Action issued Feb. 14, 2025 in corresponding European Patent Application No. 22895296.6.

\* cited by examiner

INFRARED SENSOR, SENSING SYSTEM, AND INFRARED SENSING METHOD

BACKGROUND

1. Technical Field

The present disclosure relates to an infrared sensor, a sensing system, and an infrared sensing method.

2. Description of the Related Art

Known thermal infrared sensors require no cooling. Examples of such thermal infrared sensors include thermopile thermal infrared sensors and bolometric thermal infrared sensors.

For example, Japanese Unexamined Patent Application Publication No. 2017-223644 describes an infrared sensor including an infrared photodetector, a base substrate, and a beam. The infrared photodetector and the base substrate are spaced apart from each other by the beam.

Japanese Unexamined Patent Application Publication No. 2001-309122 describes an infrared image sensor. In the infrared image sensor, a semiconductor substrate is provided with a sensor array. The sensor array includes a large number of pixel-forming regions where thermal sensor devices are disposed. The sensor array is irradiated with infrared radiation from an object whose temperature is to be measured. Thermal image data for each individual pixel is thus obtained. Thermal sensor devices are disposed in each pixel-forming region. This allows each pixel to be increased in size without causing an increase in time constant. In other words, the time constant can be reduced without changing the pixel size.

Japanese Unexamined Patent Application Publication No. 2019-105624 describes an infrared sensor including a base substrate, a bolometric infrared photodetector, and a Peltier device. The base substrate includes a recess. The Peltier effect of the Peltier device allows the bolometric infrared photodetector to be cooled in a short time. This leads to improved response speed of the infrared sensor.

SUMMARY

One non-limiting and exemplary embodiment provides a technique that is advantageous from the viewpoint of increasing the sensitivity of infrared sensing when a periodically varying load is being applied to a sensing object that is to be sensed.

The present disclosure provides an infrared sensor described below.

In one general aspect, the techniques disclosed here feature an infrared sensor including an output pixel, and a switcher. The output pixel includes infrared photodetectors, and generates an output signal. The switcher switches each of the infrared photodetectors between a first state and a second state independently with a predetermined period. The first state is a state in which the infrared photodetector is able to change in temperature in response to receiving infrared radiation. The second state is a state in which the infrared photodetector is maintained at a predetermined temperature. Each of the infrared photodetectors is maintained in the first state for a specific amount of time in the period. Switching of the infrared photodetectors from the second state to the first state is executed sequentially in the period at a predetermined time interval. Switching of the infrared photodetectors from the first state to the second state is executed sequentially in the period. The output pixel includes, as the infrared photodetectors, N infrared photodetectors. N is an integer greater than or equal to 2. The time interval divided by the period is greater than or equal to $1/(N+1)$ and less than or equal to $1/(N-1)$.

The present disclosure provides a technique that is advantageous from the viewpoint of increasing the sensitivity of infrared sensing when a periodically varying load is being applied to a sensing object.

It should be noted that general or specific embodiments may be implemented as an apparatus, a method, a system, an integrated circuit, a computer program, a computer-readable storage medium, or any selective combination thereof. Examples of computer readable storage media include non-volatile storage media such as a Compact Disc-Read Only Memory (CD-ROM).

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
FIG. 1 is a schematic plan view of an infrared sensor according to Embodiment 1.
Figure 1:
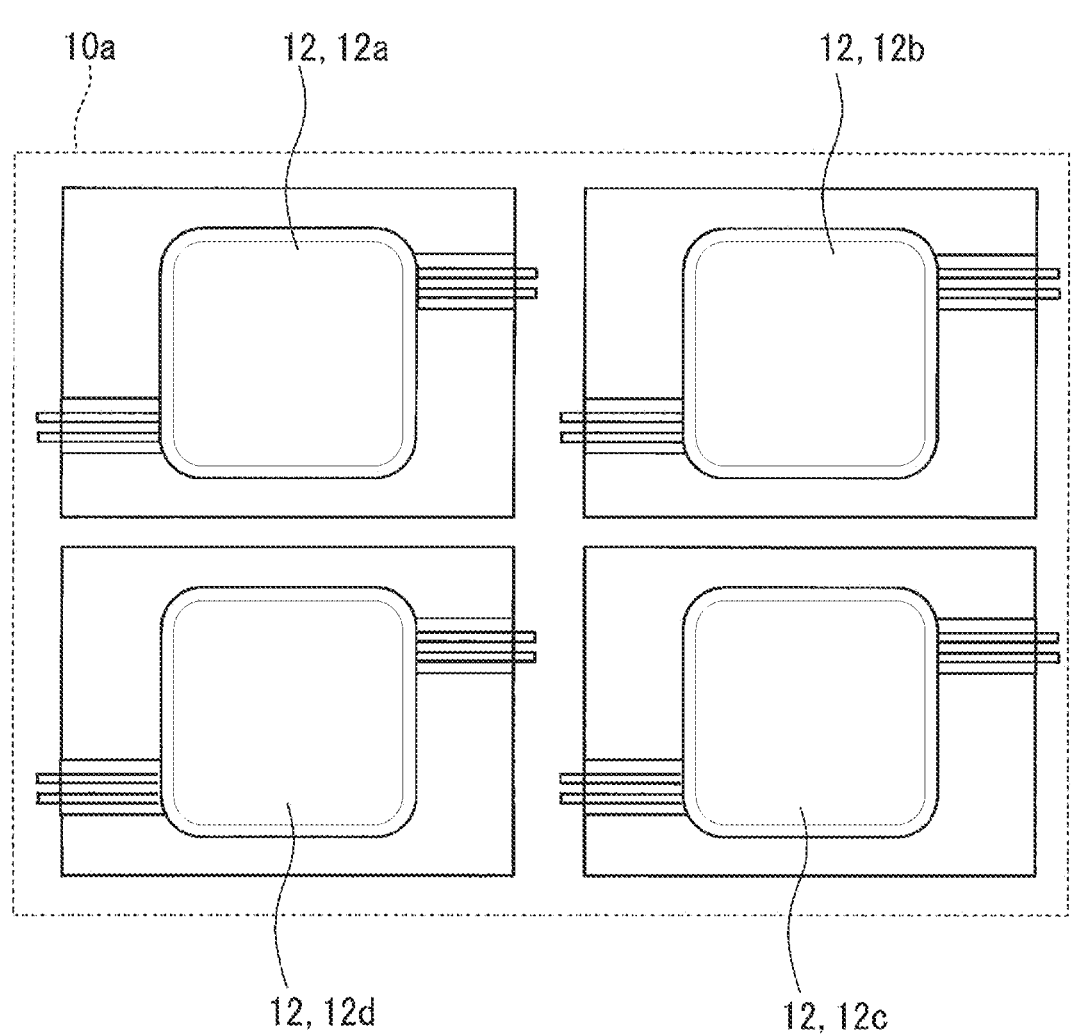

Underlying Knowledge Forming Basis of the Present Disclosure

A conceivable way to improve the sensitivity of thermal infrared sensors is to employ configurations such as increased thermal resistance of a beam or increased surface area of an infrared photodetector. For example, with the infrared sensor described in Japanese Unexamined Patent Application Publication No. 2017-223644, the beam includes a domain provided with a phononic crystal. The phononic crystal includes through-holes arranged regularly with a predetermined period. This configuration allows for increased thermal resistance of the beam.

The above-mentioned configurations intended to improve the sensitivity of thermal infrared sensors, however, may lead to increased thermal relaxation time of the infrared photodetector. A thermal relaxation time refers to the time required for the temperature of the infrared photodetector to stabilize to a steady state after the end of reception of infrared radiation. The thermal relaxation time of the infrared photodetector is closely related to the sensing speed of the thermal infrared sensor. Accordingly, an increase in the thermal relaxation time of the infrared photodetector causes a decrease in sensing speed. This means that for thermal infrared sensors, there is a tradeoff between sensitivity and sensing speed.

Generally speaking, with image sensors designed for imaging with visible light, the relaxation time for changes in the physical state of the photodetector is relatively short. Hence, the relaxation time has not been regarded as an important limiting factor for imaging speed. By contrast, with thermal infrared sensors, the principle of sensing is based essentially on changes in the physical state of the infrared photodetector as described above. The relaxation time for changes in the physical state of the infrared photodetector tends to be relatively long, and thus can be an important limiting factor for the sensing speed. To improve the sensing speed for which changes in the physical state of the infrared photodetector are a limiting factor as described above, it is necessary to address issues that are specific to infrared radiation and not considered for radiation in the visible range.

A conceivable way to achieve high-sensitivity sensing with infrared sensors is to use a method called lock-in thermography. In lock-in thermography, repeated load is externally applied at a specific frequency f to a sensing object. Examples of such repeated load include application of voltage, application of physical load, application of heat, and application of electromagnetic radiation. The sensing object subjected to the repeated load is observed with the infrared sensor. From the resulting output signal, a signal component that oscillates at the specific frequency f is extracted. Information can be thus acquired with high signal-to-noise ratio.

Studies made by the inventors have led to the understanding that, for example, with the infrared sensor described in Japanese Unexamined Patent Application Publication No. 2017-223644, the higher the thermal insulation capacity of the beam, the greater the improvement in the sensitivity of infrared reception. For such an infrared sensor, however, a higher thermal insulation capacity of the beam leads to a longer thermal relaxation time of the infrared photodetector. This is hardly an advantage from the viewpoint of sensing a sensing object that is being subjected to a periodically varying load.

For instance, in sensing with an infrared sensor, the intensity of infrared radiation is measured by electrically sensing a physical state of the infrared photodetector, such as temperature. In sensing a signal that changes in a time shorter than the thermal relaxation time of the infrared photodetector, it is not possible for changes in the physical state of the infrared photodetector to follow changes in the state of the sensing object. This may lead to a decreased sensing sensitivity. In particular, if the state of the sensing object changes periodically, the shorter the period of sensing is than the thermal relaxation time of the infrared photodetector, the weaker the resulting sensing signal tends to be.

It is also conceivable to reduce the thermal relaxation time of the infrared photodetector by reducing the surface area of the infrared photodetector. This may allow the infrared sensor to address situations when the state of the sensing object changes with a short period. This, however, merely enables sensing when the state of the sensing object can change with a period longer than the thermal relaxation time of the infrared photodetector.

The infrared sensor described in Japanese Unexamined Patent Application Publication No. 2019-105624 includes the Peltier device. This allows the temperature of the infrared photodetector to be adjusted forcibly by means of an external action, in addition to thermal relaxation due to thermal conduction. Japanese Unexamined Patent Application Publication No. 2019-105624, however, does not consider performing high-sensitivity sensing of a sensing object that is being subjected to a periodically varying load.

Accordingly, the inventors have made intensive studies on a technique for improving the sensitivity of infrared sensing when a sensing object is being subjected to a periodically varying load. As a result, the inventors have finally completed the infrared sensor according to the present disclosure.

Embodiments of Present Disclosure

Embodiments of the present disclosure will be described below with reference to the drawings. Embodiments described below each represent a generic or specific example. Specific details set forth in the following description of embodiments, such as numeric values, shapes, materials, constituent elements, the positioning of constituent elements, the connections of constituent elements, process conditions, steps, and the order of steps, are for illustrative purposes only and not intended to limit the scope of the present disclosure. Those cited in the independent claim representing the most generic concept of the present disclosure will be described as optional constituent elements. It is to be understood that the drawings are schematic in nature, and not necessarily drawn to scale.

Embodiment 1

Figure 2A:
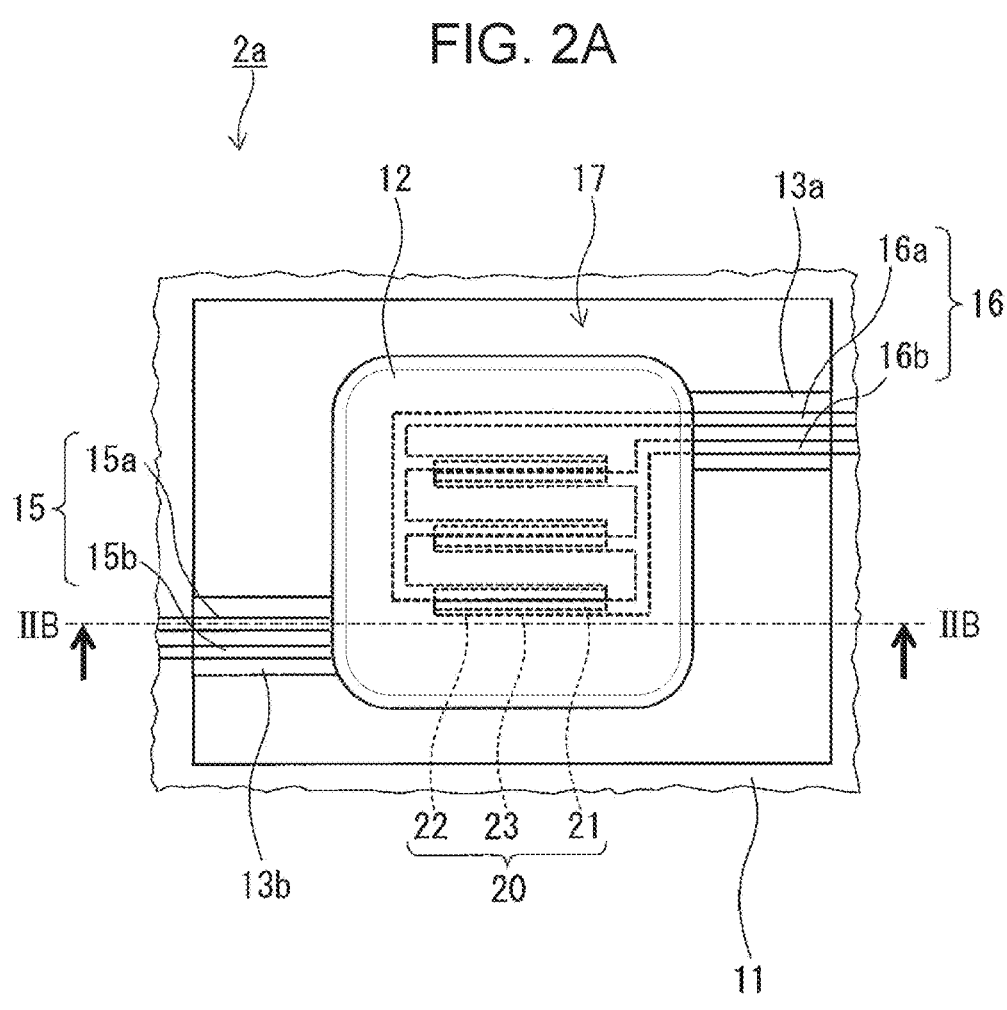
FIG. 2A is a schematic plan view of a cell included in an output pixel.
Figure 2B:
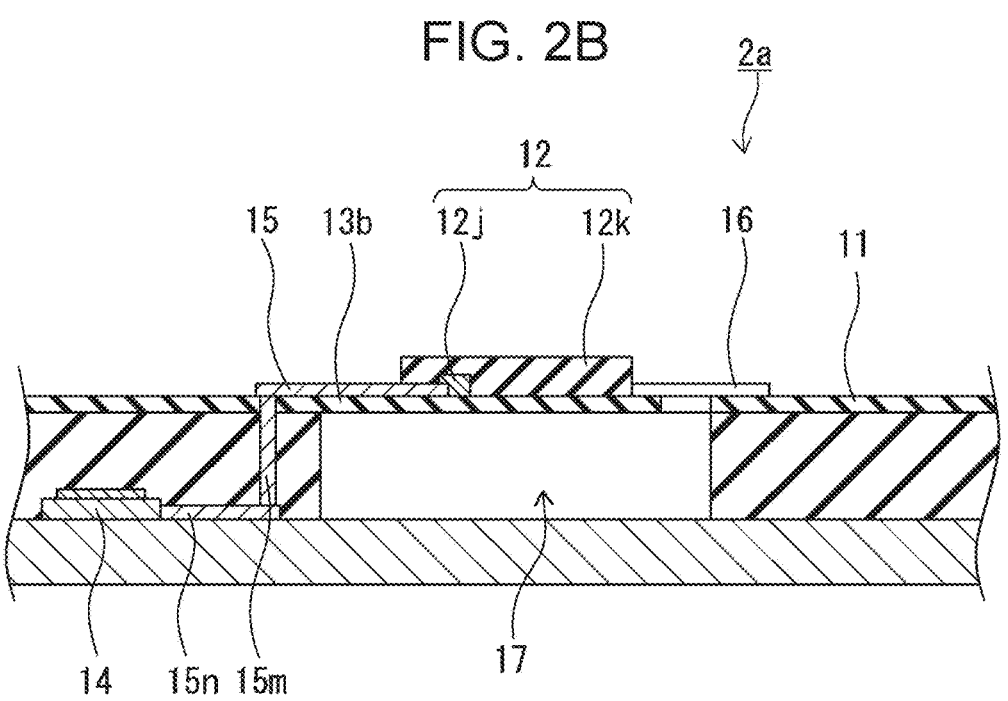
FIG. 2B is a cross-sectional view of the cell taken along a cutting-plane line IIB-IIB in FIG. 2A.

FIG. 1 is a schematic plan view of an infrared sensor 1a according to Embodiment 1. The infrared sensor 1a includes an output pixel 10a. The output pixel 10a includes infrared photodetectors 12, and generates an output signal. FIG. 2A is a schematic plan view of a cell 2a included in the output pixel 10a. FIG. 2B is a cross-sectional view of the cell 2a taken along a cutting-plane line IIB-IIB in FIG. 2A. The output pixel 10a includes cells 2a corresponding to the infrared photodetectors 12. A single infrared photodetector 12 is disposed in each cell 2a.

As illustrated in FIG. 2A, the infrared sensor 1a includes a switcher 20. The switcher 20 switches each of the infrared photodetectors 12 of the output pixel 10a between a first state S1 and a second state S2 independently with a period P. The first state S1 is a state in which the infrared photodetector 12 is able to change in temperature in response to receiving infrared radiation. The second state S2 is a state in which the infrared photodetector 12 is maintained at a predetermined temperature. In the second state S2, the infrared photodetector 12 is maintained at a predetermined temperature irrespective of the infrared radiation travelling toward the infrared photodetector 12.

Figure 3:
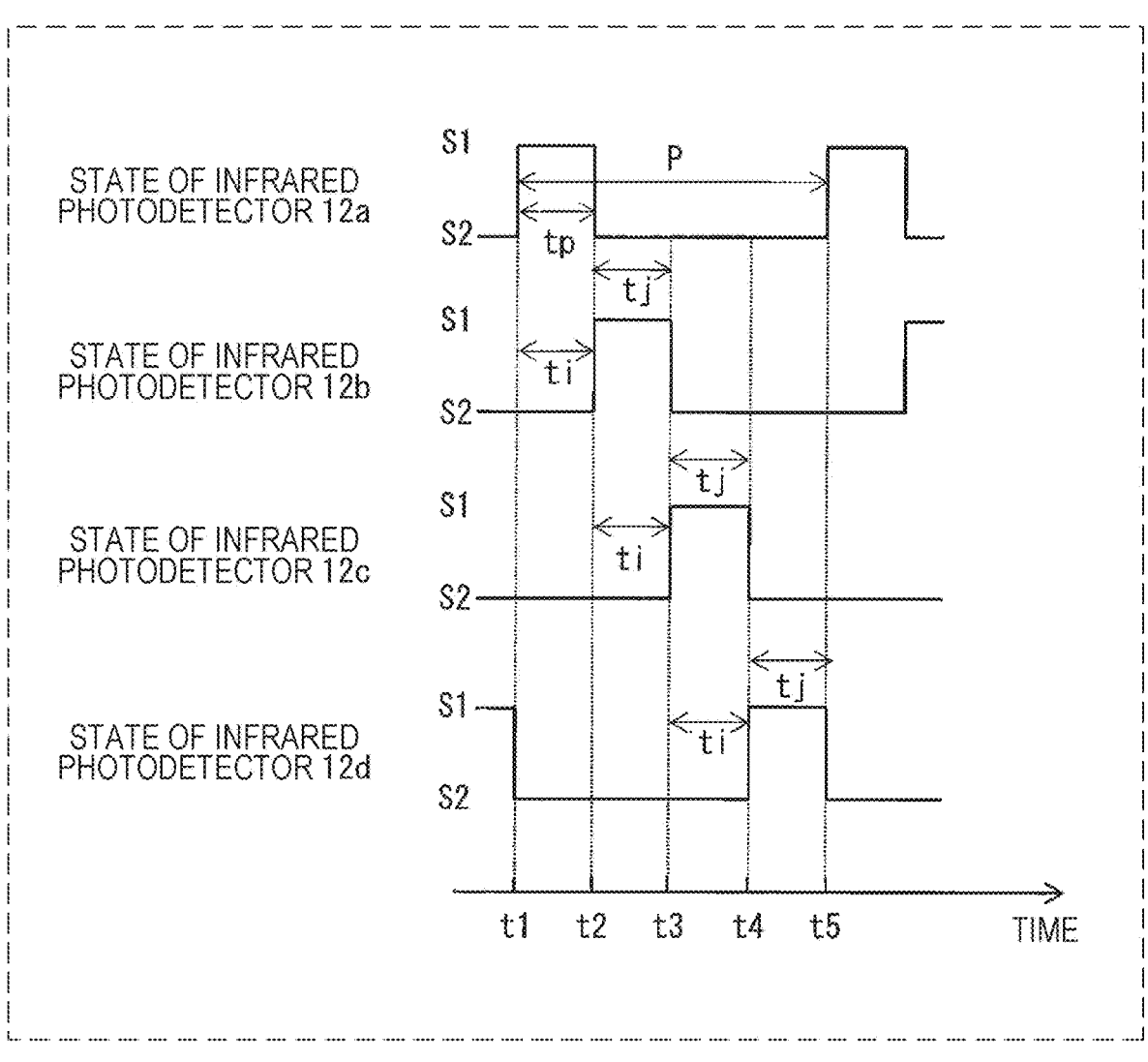
FIG. 3 is a timing chart illustrating how infrared photodetectors change their state with time.

FIG. 3 is a timing chart illustrating how the infrared photodetectors 12 of the output pixel 10a change their state with time. As illustrated in FIG. 3, each of the infrared photodetectors 12 of the output pixel 10a is maintained in the first state S1 for a specific amount of time tp in the period P. Switching of the infrared photodetectors 12 of the output pixel 10a from the second state S2 to the first state S1 is executed sequentially in the period P at a predetermined time interval ti. In addition, switching of the infrared photodetectors 12 from the first state S1 to the second state S2 is executed sequentially in the period P.

The output pixel 10a includes N infrared photodetectors 12. N is an integer greater than or equal to 2. For the infrared sensor 1a, a value ti/P, which represents the time interval ti divided by the period P, is greater than or equal to 1/(N+1) and less than or equal to 1/(N−1). This facilitates allowing the infrared sensor 1a to exhibit high sensitivity when a sensing object is being subjected to a periodically varying load. Moreover, if the value ti/P is greater than or equal to 1/(N+1) for the infrared sensor 1a, the number of infrared photodetectors 12 that are in the first state S1 at the same time in the period P can be reduced. This facilitates increasing the sensing speed of the infrared sensor 1a. If the value ti/P is less than or equal to 1/(N−1) for the infrared sensor 1a, this facilitates ensuring that at least one of the infrared photodetectors 12 be in the first state for most of the period P. This facilitates increased sensitivity of infrared sensing.

As illustrated in FIG. 1, the output pixel 10a of the infrared sensor 1a includes, for example, the following infrared photodetectors 12: an infrared photodetector 12a, an infrared photodetector 12b, an infrared photodetector 12c, and an infrared photodetector 12d. In other words, for the infrared sensor 1a, for example, N is 4. As illustrated in FIG. 3, for example, switching of the infrared photodetector 12a, the infrared photodetector 12b, the infrared photodetector 12c, and the infrared photodetector 12d from the second state S2 to the first state S1 is executed sequentially in the period P at the time interval ti. For example, switching of the infrared photodetector 12a, the infrared photodetector 12b, the infrared photodetector 12c, and the infrared photodetector 12d from the first state S1 to the second state S2 is executed sequentially in the period P at a predetermined time interval tj. The time interval tj is, for example, equal to the time interval ti.

Figure 4:
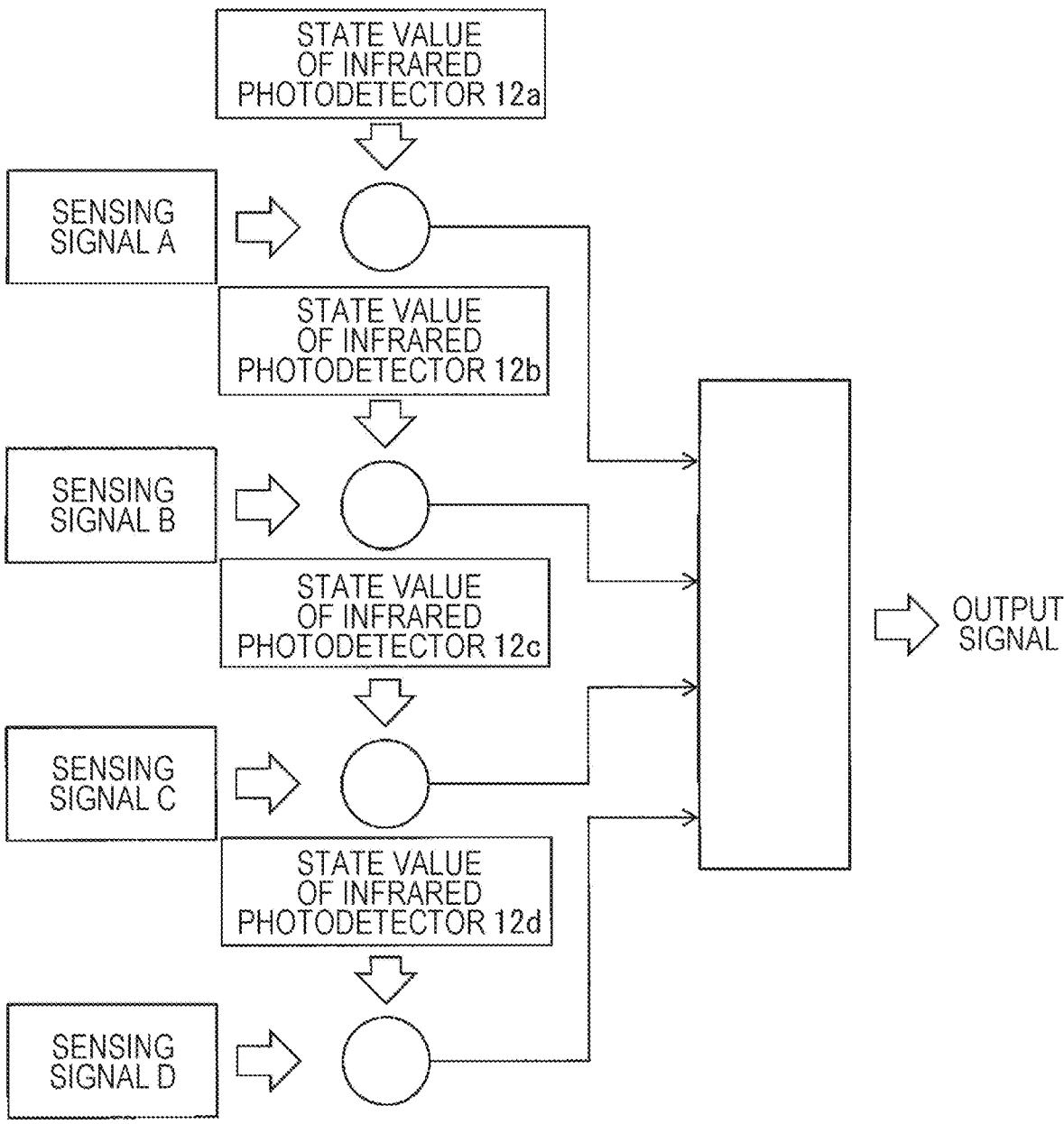
FIG. 4 schematically illustrates generation of an output signal from the output pixel.

FIG. 4 schematically illustrates generation of an output signal from the output pixel 10a. Generation of the output signal is performed by, for example, a predetermined signal processing circuit. A sensing signal sensed by each cell 2a of the output pixel 10a is multiplied by a state value representing the state of the infrared photodetector 12 of each cell 2a. In this way, an output value from each cell 2a is determined. The infrared photodetector 12 has a state value X when the infrared photodetector 12 is in the first state S1. The infrared photodetector 12 has a state value 0 when the infrared photodetector 12 is in the second state S2. In other words, in generating an output signal, an output from the infrared photodetector 12 that is in the second state S2 is regarded as zero. X is a predetermined real number excluding 0. X may be, for example, 1. An output signal from the output pixel 10a is determined as the sum of output values from all the cells 2a included in the output pixel 10a in the period P. In FIG. 4, a sensing signal A is, for example, a signal sensed by the cell 2a including the infrared photodetector 12a. A sensing signal B is, for example, a signal sensed by the cell 2a including the infrared photodetector 12b. A sensing signal C is, for example, a signal sensed by the cell 2a including the infrared photodetector 12c. A sensing signal D is, for example, a signal sensed by the cell 2a including the infrared photodetector 12d.

Figure 5:
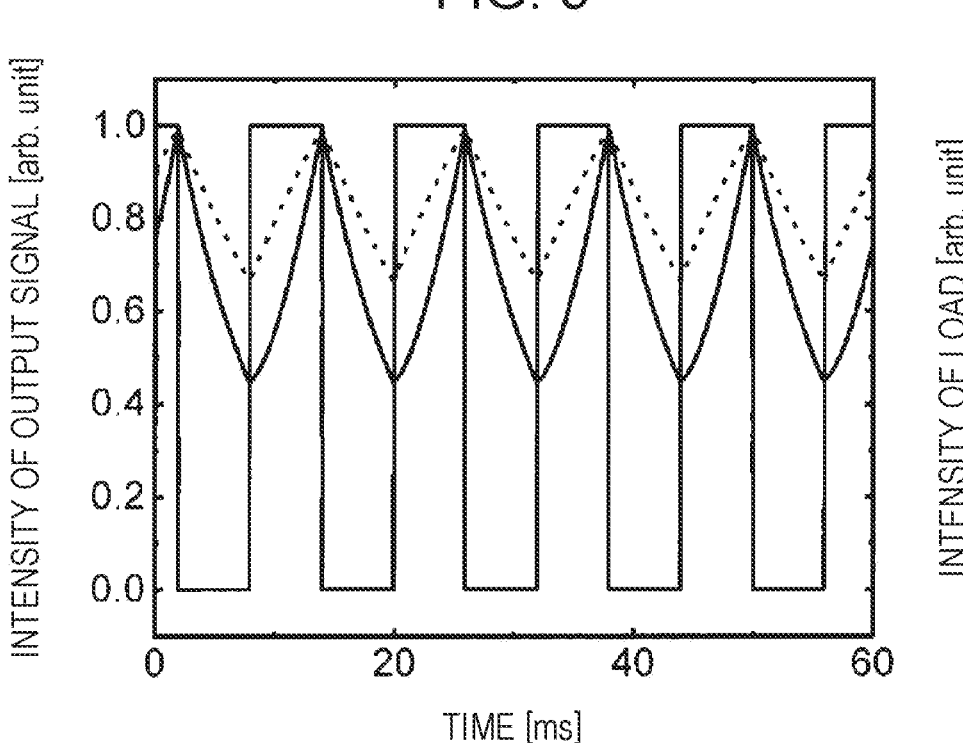
FIG. 5 is a graph illustrating an exemplary output signal obtained with an infrared sensor.

FIG. 5 is a graph illustrating an exemplary output signal obtained with the infrared sensor 1a. The rectangular wave in FIG. 5 represents variation of the intensity of a load applied to a sensing object. In FIG. 5, a load that varies with a period of 12 milliseconds (ms) is applied to the sensing object. The solid line in FIG. 5 represents an output signal obtained with the infrared sensor 1a. The dashed line in FIG. 5 represents an output signal obtained with an infrared sensor according to Comparative Example, which is similar in configuration to the infrared sensor 1a except that no switcher 20 is provided. For the infrared sensor according to Comparative Example, the infrared photodetector 12 has a thermal relaxation time of 15 ms. A thermal relaxation time refers to the time required for the temperature of the infrared photodetector 12 to stabilize to a steady state after the end of reception of infrared radiation by the infrared photodetector 12. In the example illustrated in FIG. 5, the period P with which the states of the infrared photodetector 12 are switched by the switcher 20 of the infrared sensor 1a is 12 ms. As described above, in the example illustrated in FIG. 5, the period P is shorter than the thermal relaxation time of the infrared photodetector 12.

With the infrared sensor according to Comparative Example, the load applied to the sensing object varies with a period shorter than the thermal relaxation time of the infrared photodetector 12. Accordingly, the output signal exhibits a small amplitude. With the infrared sensor 1a, by contrast, the output signal has a large amplitude relative to the infrared sensor according to Comparative Example. It is thus appreciated that the infrared sensor 1a has a comparatively higher sensitivity.

Figure 6:
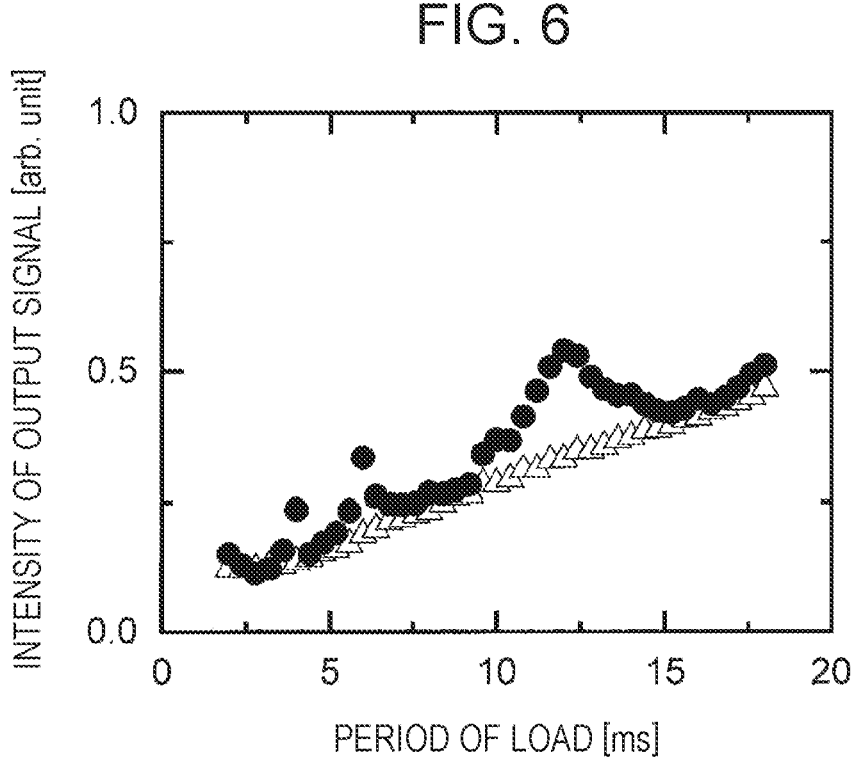
FIG. 6 is a graph illustrating the relationship between the intensity of an output signal and the period of load.

FIG. 6 is a graph illustrating the relationship between the intensity of an output signal and the period of load. In FIG. 6, the plot of filled circles represent results on the infrared sensor 1a, and the plot of open triangles represents results on the infrared sensor according to Comparative Example. In the example illustrated in FIG. 6, the period P is 12 ms for the infrared sensor 1a. As can be appreciated from FIG. 6, if the load applied to the sensing object varies with a period close to the period P for the infrared sensor 1a, this facilitates increased intensity of the output signal, and consequently increased sensitivity of sensing.

A value tp/P, which represents the specific amount of time tp divided by the period P, is not limited to a specific value. The value tp/P is, for example, greater than or equal to 0.5/N and less than or equal to 2/N. This facilitates allowing the infrared sensor 1*a* to exhibit high sensitivity when the sensing object is being subjected to a periodically varying load.

In one example, the switcher 20 may switch the states of the infrared photodetectors 12 such that, throughout the entire period P, at least one of the infrared photodetectors 12 included in the output pixel 10*a* is in the first state. In another example, to reset the physical states of the infrared photodetectors 12 all at once, the switcher 20 may switch all of the infrared photodetectors 12 included in the output pixel 10*a* to the second state at a specific point in time.

For example, the number of infrared photodetectors 12 of the output pixel 10*a* that are simultaneously in the first state S1 is less than or equal to 2. This facilitates allowing the infrared sensor 1*a* to exhibit high sensing sensitivity even when the load applied to the sensing object varies with a short period. In this case, the duration for which two infrared photodetectors 12 are both in the first state S1 may be short. For example, a value obtained by dividing, by the period P, the duration for which two infrared photodetectors 12 are both in the first state S1 is, for example, less than or equal to $\frac{1}{100}$.

The sensing object to be sensed by the infrared sensor 1*a* is subjected to, for example, a load that varies with a predetermined period. The load is applied to the sensing object in the form of voltage, physical load, heat, or electromagnetic radiation. In this case, the period P may be adjusted in accordance with the period of variation, $P_L$, of the load. The ratio of the period P to the period of variation $P_L$ is, for example, greater than or equal to 0.8 and less than or equal to 1.2.

The number N of the infrared photodetectors 12 of the output pixel 10*a* is not limited to a specific value as long as the output pixel 10*a* includes multiple infrared photodetectors 12. The output pixel 10*a* includes, for example, a square number of infrared photodetectors 12. In the output pixel 10*a*, the square number of infrared photodetectors 12 may be disposed adjacent to each other. This facilitates achieving dense arrangement of the infrared photodetectors 12 in the output pixel 10*a*.

Figure 7:
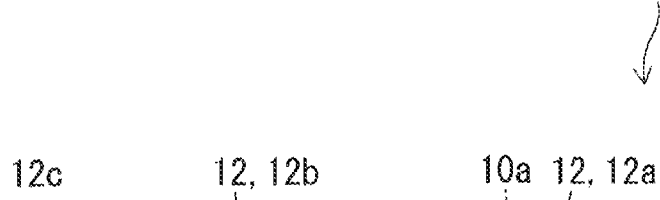
FIG. 7 is a schematic plan view of a modification of the infrared sensor according to Embodiment 1.
Figure 7:
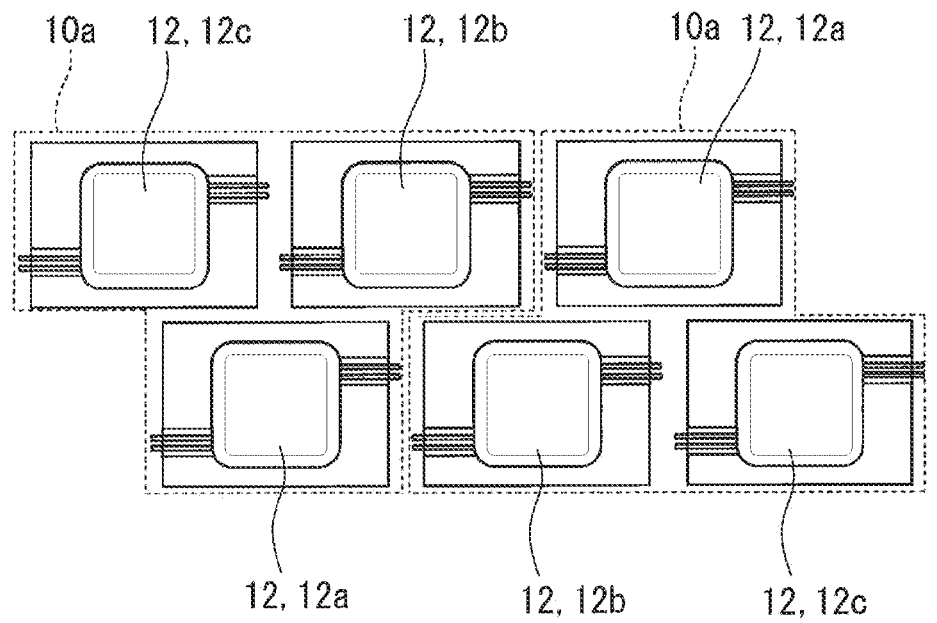

FIG. 7 is a schematic plan view of a modification of the infrared sensor 1*a*. As illustrated in FIG. 7, the output pixel 10*a* may include three infrared photodetectors 12. This facilitates reduced size of the infrared sensor 1*a* in a specific direction. The output pixel 10*a* may include six infrared photodetectors 12. This facilitates allowing the infrared sensor 1*a* to exhibit high sensitivity even when the load applied to the sensing object varies with a shorter period. The output pixel 10*a* may include nine infrared photodetectors 12. This facilitates allowing the infrared sensor 1*a* to exhibit high sensing sensitivity even when the load applied to the sensing object varies with an even shorter period.

The number of output pixels 10*a* in the infrared sensor 1*a* is not limited to a specific value. The infrared sensor 1*a* includes a single output pixel 10*a*, or two or more output pixels 10*a*.

The infrared sensor 1*a* is not limited to a specific sensor as long as the infrared sensor 1*a* is capable of infrared sensing. The infrared sensor 1*a* may be, for example, a thermopile infrared sensor, or may be a bolometric infrared sensor. In other words, the infrared photodetector 12 may be a thermopile infrared photodetector, or may be a bolometric infrared photodetector. For such a thermopile infrared photodetector and a bolometric infrared photodetector, known configurations, known manufacturing methods, and known infrared detection methods may be employed.

As illustrated in FIG. 2A, the infrared sensor 1*a* includes, for example, a substrate 11, a first beam 13*a*, and a second beam 13*b*. The substrate 11 has a recess 17. The infrared photodetector 12 is spaced apart from the bottom face of the recess 17 due to the presence of the first beam 13*a* and the second beam 13*b*. The infrared sensor 1*a* may be modified such that the substrate 11 and the infrared photodetector 12 are spaced apart by means of a beam connected to the infrared photodetector 12 and suspended on a supporting column provided on the substrate.

The infrared sensor 1*a* further includes, for example, a first wiring line 15, and a second wiring line 16. The first wiring line 15 is a wiring line for transferring a signal from the infrared photodetector 12. The second wiring line 16 is a wiring line for transferring a control signal for the switcher 20. The second wiring line 16 and the first wiring line 15 are disposed independently from each other.

As illustrated in FIG. 2B, the infrared sensor 1*a* includes, for example, a signal processing circuit 14. The first wiring line 15 is connected at one end to the infrared photodetector 12. The first wiring line 15 is connected at the other end to the signal processing circuit 14. The signal processing circuit 14 is, for example, disposed in the substrate 11. Alternatively, the signal processing circuit 14 may be disposed on the substrate 11. The first wiring line 15 includes an internal wiring line 15*m* and an internal wiring line 15*n*, which are disposed in the substrate 11. The internal wiring line 15*m* extends in the direction of thickness of the substrate 11. The internal wiring line 15*n* extends in a direction perpendicular to the internal wiring line 15*m*. The internal wiring line 15*n* is connected to the signal processing circuit 14.

As illustrated in FIG. 2A, the second wiring line 16 is connected at one end to the switcher 20. The second wiring line 16 is connected at the other end to a control circuit (not illustrated). A control signal generated in the control circuit is transmitted through the second wiring line 16 to the switcher 20. The infrared photodetector 12 is thus switched between the first state S1 and the second state S2.

Reference is now made to an example of infrared sensing with the infrared sensor 1*a*. As illustrated in FIG. 2B, the infrared photodetector 12 includes, for example, an absorber 12*k*, and a joint 12*j*. When the infrared photodetector 12 is in the first state S1, infrared radiation impinging on the cell 2*a* is absorbed by the absorber 12*k*. This may cause the infrared photodetector 12 to change in physical state. For example, the infrared photodetector 12 changes in temperature. An electrical signal corresponding to such a change in the physical state of the infrared photodetector 12 is transferred through the first wiring line 15 to the signal processing circuit 14. This allows for sensing of the intensity of the infrared radiation absorbed by the infrared photodetector 12.

To generate an electrical signal corresponding to a change in the physical state of the infrared photodetector 12, for example, the infrared sensor 1*a* may employ a thermopile infrared photodetector. As illustrated in FIG. 2A, the first wiring line 15 includes a first part 15*a* and a second part 15*b*. For example, the first part 15*a* is made of a material having a first Seebeck coefficient. The second part 15*b* is made of a material having a second Seebeck coefficient different from the first Seebeck coefficient. The joint 12*j* is disposed in the infrared photodetector 12 between the first part 15*a* and the second part 15*b*. A Seebeck electromotive force that varies with the temperature at the joint 12*j* develops between the first part 15*a* and the second part 15*b*. The difference between the first Seebeck coefficient and the second Seebeck coefficient is, for example, greater than or equal to 10 µV/K.

The difference is, for example, less than or equal to 1 mV/K. As used herein, the term Seebeck coefficient means a value at 25° C.

The switcher 20 of the infrared sensor 1a is not limited to a specific mechanism as long as the switcher 20 allows switching of the infrared photodetectors 12 from the first state S1 to the second state S2. The switcher 20 includes, for example, a Peltier device.

As illustrated in FIG. 2A, the switcher 20 includes, for example, a p-type part 21, an n-type part 22, and a conductive part 23. In the infrared photodetector 12, the p-type part 21 and the n-type part 22 are joined together to form a Peltier device. In this case, the interface between the p-type part 21 and the n-type part 22 corresponds to the cold junction of the Peltier device. The p-type part 21 is made of a p-type semiconductor. The n-type part 22 is made of an n-type semiconductor. Each of the p-type semiconductor and the n-type semiconductor is not limited to a specific semiconductor. Each of the p-type semiconductor and the n-type semiconductor is, for example, a silicon-based material such as Si or SiGe.

In plan view, the conductive part 23 is positioned to cover the interface of the p-type part 21 and the n-type part 22, and to span across the p-type part 21 and the n-type part 22. The presence of the conductive part 23 facilitates increased electric current flowing between the p-type part 21 and the n-type part 22. No conductive part 23 may be provided. The Peltier device may have no interface between the p-type part 21 and the n-type part 22. In this case, the conductive part 23 is positioned to span across the p-type part 21 and the n-type part 22, and the conductive part 23 corresponds to the cold junction of the Peltier device.

As illustrated in FIG. 2A, the second wiring line 16 includes, for example, a p-type wiring line 16a, and an n-type wiring line 16b. The p-type wiring line 16a is connected to the p-type part 21. The n-type wiring line 16b is connected to the n-type part 22. A control signal output from the control circuit passes through the second wiring line 16, and an electric current flows through the p-type part 21 and the n-type part 22, giving rise to the Peltier effect. Consequently, even when the absorber 12k of the infrared photodetector 12 absorbs infrared radiation, the infrared photodetector 12 is cooled by the Peltier device, and thus maintained at a predetermined temperature. This results in the infrared photodetector 12 switching to the second state. By contrast, when supply of the control signal from the control circuit to the switcher 20 stops, the infrared photodetector 12 switches to the first state S1. The p-type wiring line 16a may be made of a p-type semiconductor. The n-type wiring line 16b may be made of an n-type semiconductor.

In the switcher 20, the number of interfaces of the p-type part 21 and the n-type part 22 is not limited to a specific value. In the infrared photodetector 12, the number of interfaces of the p-type part 21 and the n-type part 22 may be one, or may be two or more. Presence of two or more interfaces of the p-type part 21 and the n-type part 22 facilitates uniform cooling of the infrared photodetector 12.

A method for manufacturing the infrared sensor 1a is described below. The method for manufacturing the infrared sensor 1a is not limited to a specific method. FIG. 8A, FIG. 8B, FIG. 8C, FIG. 8D, and FIG. 8E each illustrate, in cross-sectional view, an exemplary method for manufacturing the infrared sensor 1a. Each cross-sectional view corresponds to the cross-sectional view illustrated in FIG. 2B.

Figure 8A:
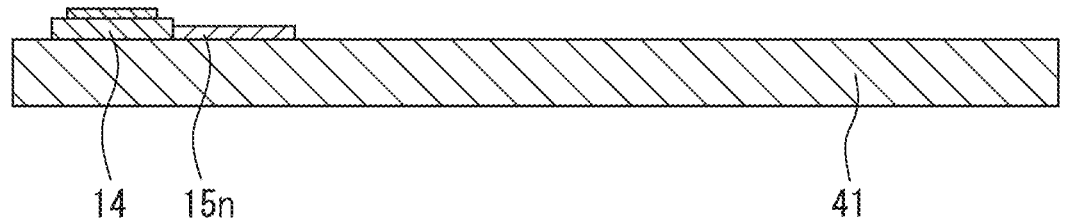
FIG. 8A illustrates, in cross-sectional view, an exemplary method for manufacturing the infrared sensor according to Embodiment 1.

As illustrated in FIG. 8A, first, a Si substrate 41 is prepared. The signal processing circuit 14 is then formed on the Si substrate 41. The internal wiring line 15n is also formed on the Si substrate 41. The internal wiring line 15n can be formed by, for example, photolithography and sputtering. The signal processing circuit 14 can be formed by a known method. The internal wiring line 15n is made of, for example, a material such as Al.

Figure 8B:
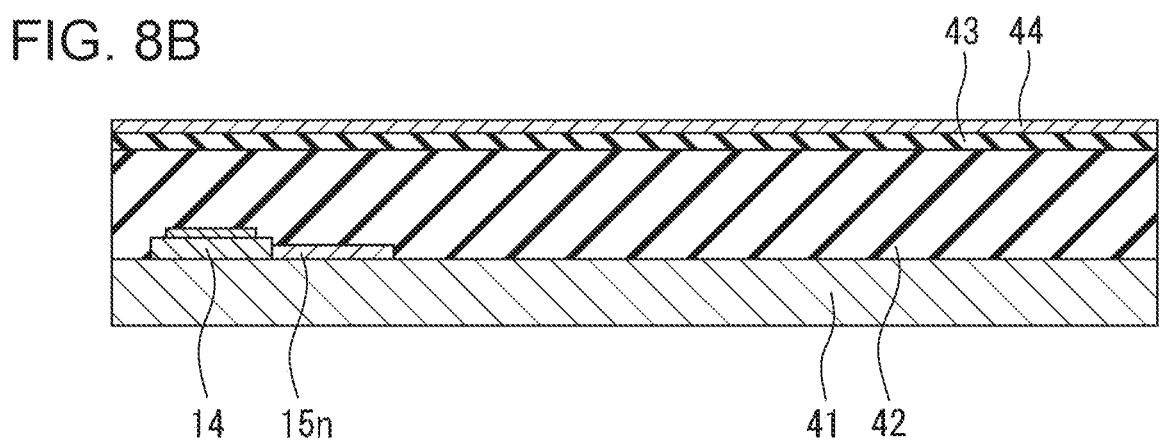
FIG. 8B illustrates, in cross-sectional view, the exemplary method for manufacturing the infrared sensor according to Embodiment 1.

Subsequently, as illustrated in FIG. 8B, an insulating layer 42 made of SiO$_2$ is formed. A beam layer 43 is then formed. The beam layer 43 is made of, for example, a material such as SiN or SiO$_2$. A wiring layer 44 is then formed. The wiring layer 44 is made of, for example, a material such as Si. The insulating layer 42, the beam layer 43, and the wiring layer 44 can be formed by, for example, a chemical vapor deposition (CVD) process.

Figure 8C:
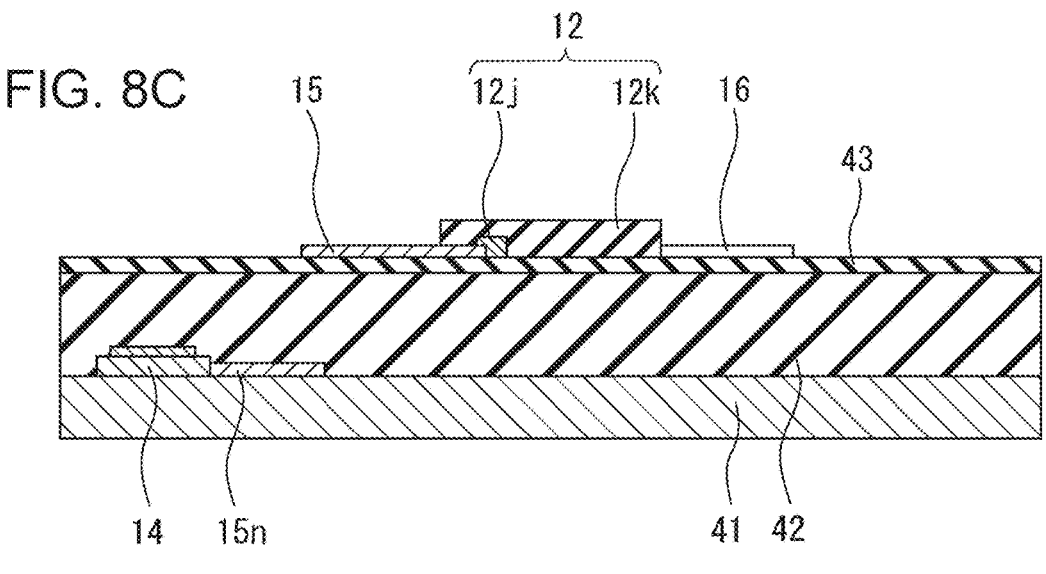
FIG. 8C illustrates, in cross-sectional view, the exemplary method for manufacturing the infrared sensor according to Embodiment 1.

Subsequently, as illustrated in FIG. 8C, the first wiring line 15 and the second wiring line 16 are formed. The wiring layer 44 is then doped with a predetermined dopant. As a result, a first region, a second region, a third region, a fourth region, a fifth region, and a sixth region are formed that respectively correspond to the first part 15a, the second part 15b, the p-type wiring line 16a, the n-type wiring line 16b, the p-type part 21, and the n-type part 22. The first region, the third region, and the fifth region are, for example, p-type doped, and the second region, the fourth region, and the sixth region are, for example, n-type doped. Then, through lithography and selective etching performed on the wiring layer 44, the first wiring line 15, the second wiring line 16, the p-type wiring line 16a, the n-type wiring line 16b, the p-type part 21, and the n-type part 22 are formed. Subsequently, the joint 12j is formed so as to span across one end of the first part 15a and one end of the second part 15b. This ensures electrical continuity for the first wiring line 15. The conductive part 23 is formed so as to span across one end of the p-type part 21 and one end of the n-type part 22. This ensures electrical continuity for the second wiring line 16 and the switcher 20. Then, an infrared absorber layer is formed, and the absorber 12k is formed through lithography and selective etching. The joint 12j is made of, for example, a material such as W, Al, or an Al alloy. The absorber 12k is made of, for example, a material such as SiO$_2$. The conductive part 23 is made of, for example, a material such as W, Al, or an Al alloy.

Figure 8D:
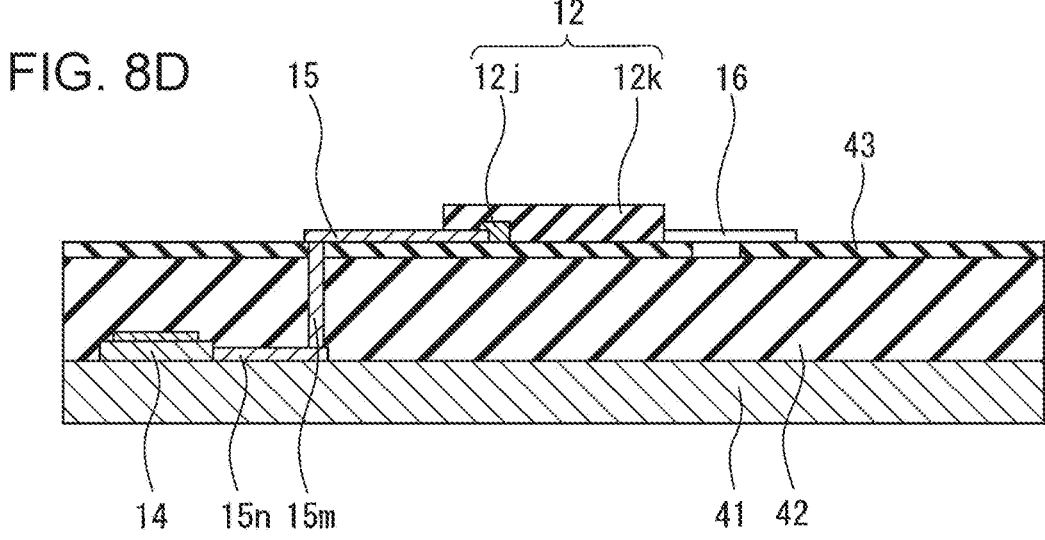
FIG. 8D illustrates, in cross-sectional view, the exemplary method for manufacturing the infrared sensor according to Embodiment 1.

Subsequently, as illustrated in FIG. 8D, the internal wiring line 15m is formed so as to provide electrical connection between the internal wiring line 15n formed on the Si substrate 41, and a portion of the first wiring line 15 that is formed on the beam layer 43. The internal wiring line 15m can be formed by, for example, forming a hole in each of the insulating layer 42, the beam layer 43, and the first wiring line 15 through etching, and then filling the hole with an electrically conductive material through sputtering. The internal wiring line 15m is made of, for example, W, Al, or an Al alloy. Then, the infrared photodetector 12, the first beam 13a, and the second beam 13b are formed through lithography and selective etching performed on the beam layer 43.

Figure 8E:
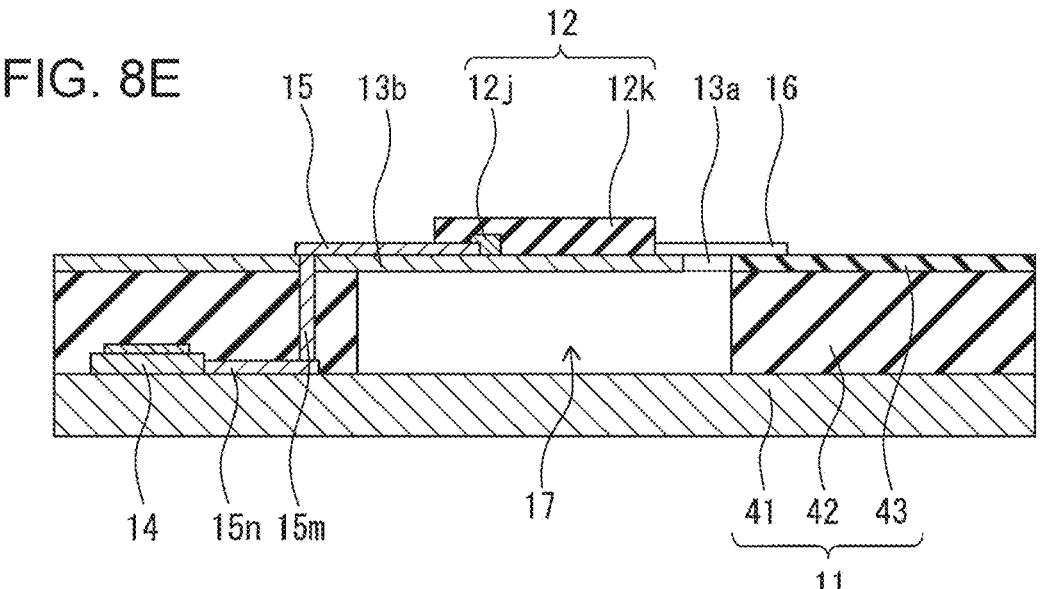
FIG. 8E illustrates, in cross-sectional view, the exemplary method for manufacturing the infrared sensor according to Embodiment 1.

Lastly, as illustrated in FIG. 8E, the recess 17 is formed through selective etching performed on the insulating layer 42. The presence of the recess 17 allows the infrared photodetector 12, a portion of the first beam 13a, and a portion of the second beam 13b to be spaced apart from the substrate 11.

Embodiment 2

Figure 9A:
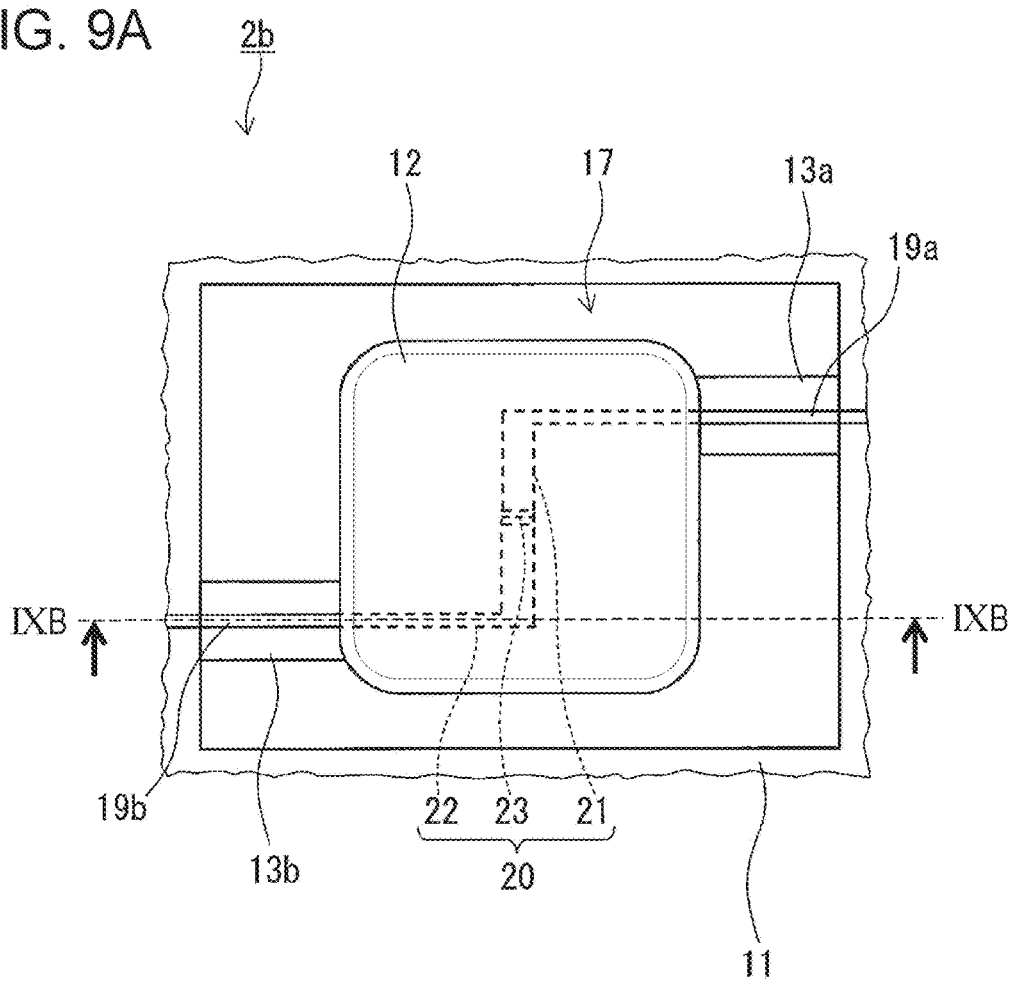
FIG. 9A is a schematic plan view of a cell of an infrared sensor according to Embodiment 2.
Figure 9B:
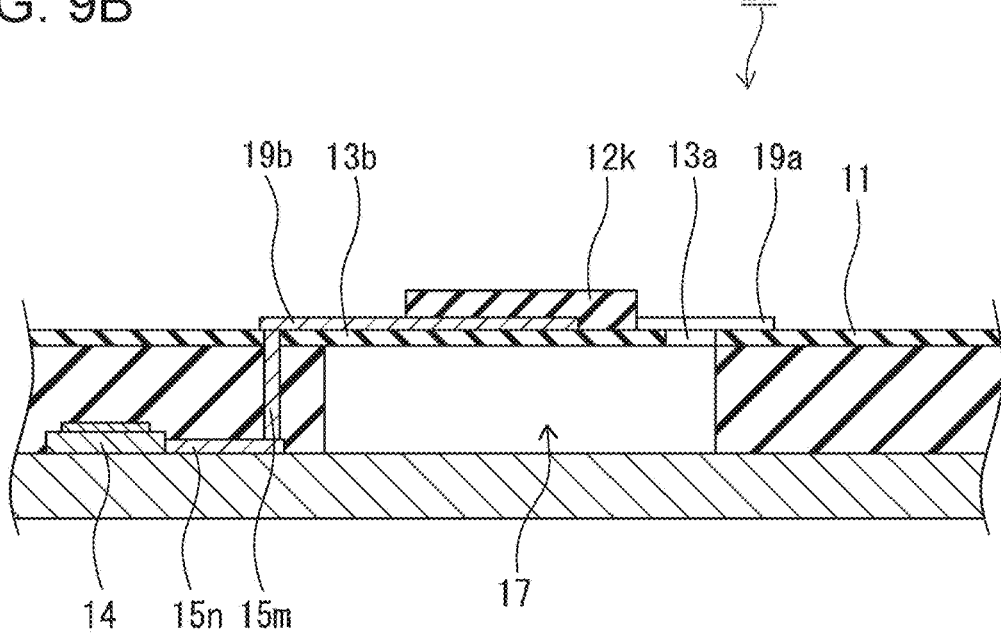
FIG. 9B is a cross-sectional view of the cell taken along a cutting-plane line IXB-IXB in FIG. 9A.

FIG. 9A is a schematic plan view of a cell 2b of an infrared sensor according to Embodiment 2. FIG. 9B is a cross-sectional view of the cell 2b taken along a cutting-plane line IXB-IXB in FIG. 9A. The infrared sensor according to Embodiment 2 is similar in configuration to the infrared sensor 1a, except as otherwise specifically described herein. Constituent elements of the cell 2b identical or corresponding to the constituent elements of the cell 2a are designated by the same reference signs, and not described in further detail. Descriptions related to the cell 2a also apply to the cell 2b as long as no technical contradiction arises.

As illustrated in FIG. 9A and FIG. 9B, the cell 2b includes a wiring line 19a and a wiring line 19b. These wiring lines serve to both transfer a signal from the infrared photodetector 12, and transfer a control signal to the switcher 20.

The infrared photodetector 12 in the cell 2b is, for example, a thermopile infrared photodetector. Absorption of infrared radiation by the absorber 12k of the infrared photodetector 12 gives rise to a Seebeck electromotive force. A signal caused by the Seebeck electromotive force passes from the infrared photodetector 12 through the wiring line 19a and the wiring line 19b. The signal is thus acquired. Meanwhile, a control signal for the switcher 20 is transferred to the switcher 20 through the wiring line 19a and the wiring line 19b, and the switcher 20 is controlled. In this way, in the infrared sensor according to Embodiment 2, acquisition of a signal for infrared sensing, and control of the switcher 20 are achieved by use of the wiring line 19a and the wiring line 19b. The above-mentioned configuration of the cell 2b facilitates reducing the number of wiring lines, and reducing thermal conductivity between the infrared photodetector 12 and the substrate 11. This facilitates allowing the infrared sensor according to Embodiment 2, which includes the cell 2b, to exhibit high sensing sensitivity.

The operating principle of the infrared sensor according to Embodiment 2 is the same as the operating principle of the infrared sensor 1a.

The infrared sensor according to Embodiment 2 can be manufactured by, for example, known methods including a thin-film forming method and a microfabrication method. Examples of the thin-film forming method include sputtering and vapor deposition. Examples of the microfabrication method include photolithography and selective etching. The infrared sensor according to Embodiment 2 can be also manufactured by the above-mentioned method used for manufacturing the infrared sensor 1a according to Embodiment 1.

Embodiment 3

Figures 10A, 10B:
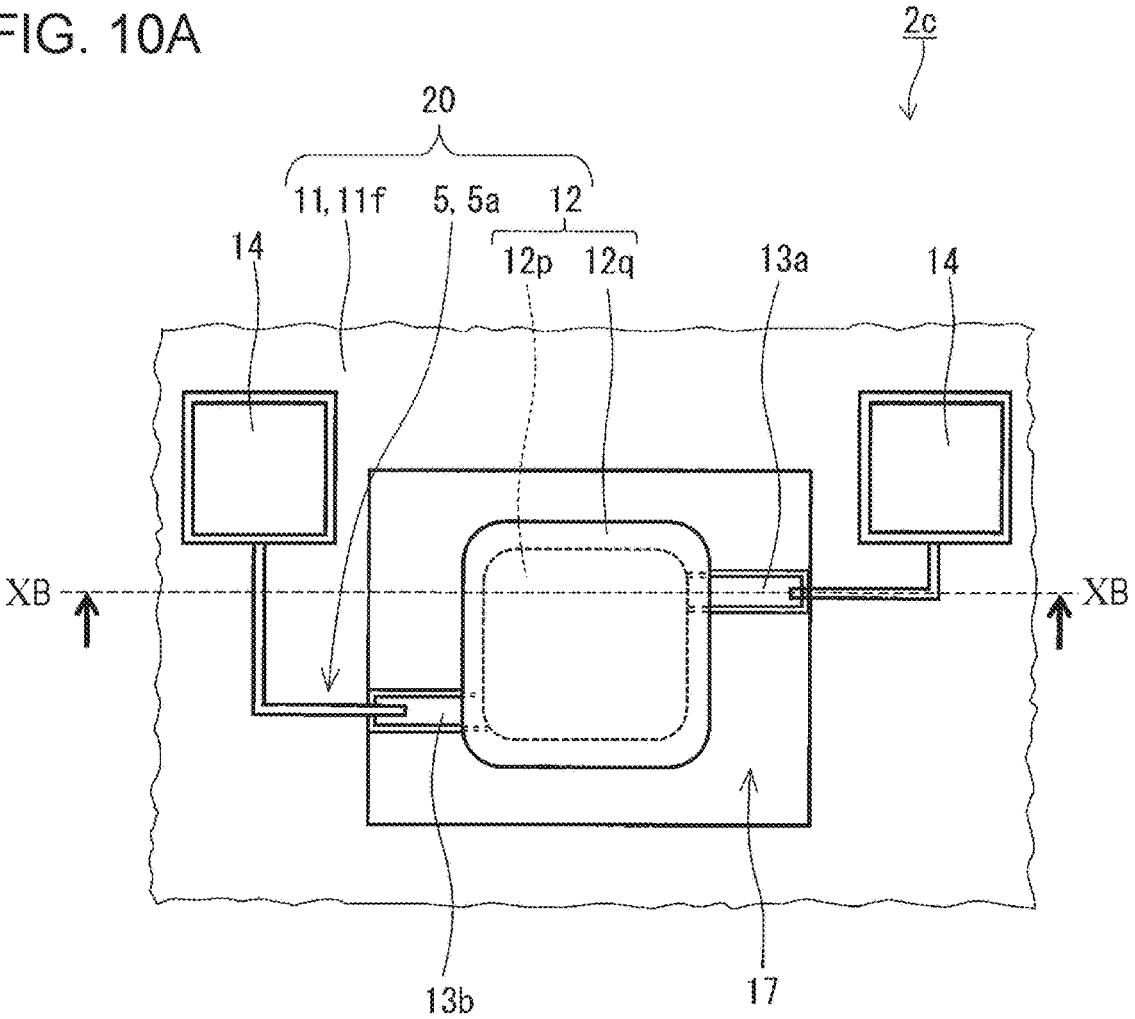
FIG. 10A is a schematic plan view of a cell of an infrared sensor according to Embodiment 3.
FIG. 10B is a cross-sectional view of the cell taken along a cutting-plane line XB-XB in FIG. 10A.

FIG. 10A is a schematic plan view of a cell 2c of an infrared sensor according to Embodiment 3. FIG. 10B is a cross-sectional view of the cell 2c taken along a cutting-plane line XB-XB in FIG. 10A. The infrared sensor according to Embodiment 3 is similar in configuration to the infrared sensor 1a, except as otherwise specifically described herein. Constituent elements of the cell 2c identical or corresponding to the constituent elements of the cell 2a are designated by the same reference signs, and not described in further detail. Descriptions related to the cell 2a also apply to the cell 2c as long as no technical contradiction arises.

As illustrated in FIG. 10A and FIG. 10B, the cell 2c includes a component 11f constituting a heat bath. The infrared photodetector 12 includes a stack of at least two materials with different thermal expansion coefficients. In switching from the first state S1 to the second state S2, the infrared photodetector 12 deforms in response to application of a control signal Sd having an electric current value Is greater than or equal to a predetermined value, and at least part of the infrared photodetector 12 comes into contact with the component 11f. Due to the resulting thermal conduction between the infrared photodetector 12 and the component 11f, the infrared photodetector 12 is maintained at a predetermined temperature. That is, the infrared photodetector 12 is now in the second state S2.

Figure 11A:
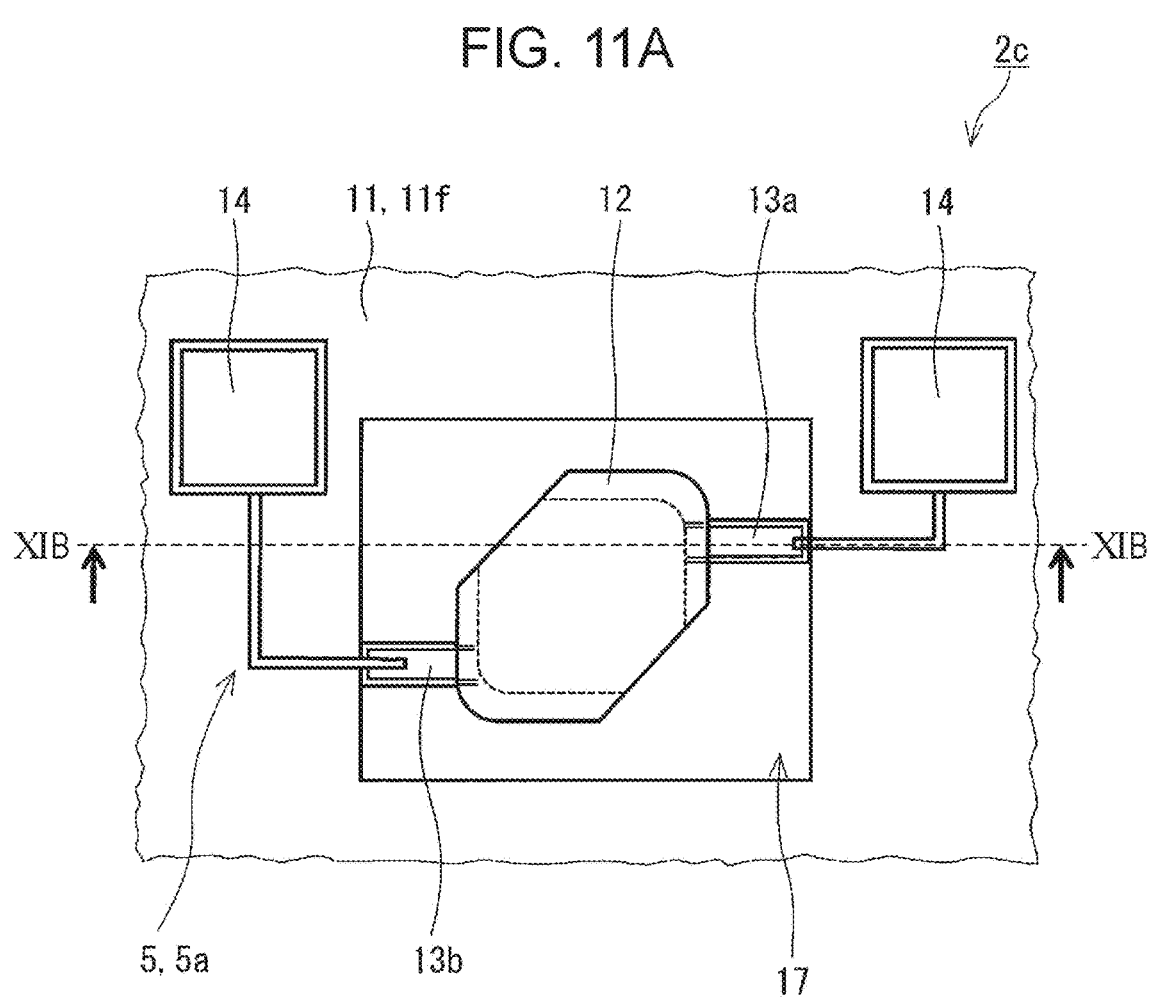
FIG. 11A is a schematic plan view of a cell of the infrared sensor according to Embodiment 3, with an infrared photodetector of the cell being in a second state.
Figure 11B:
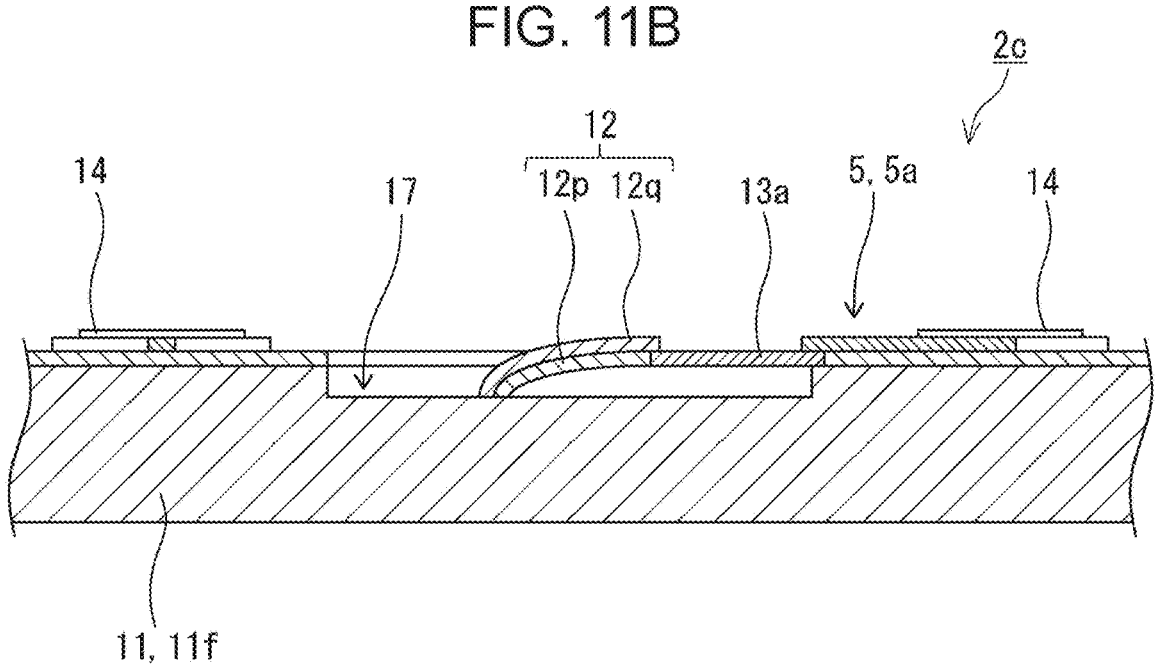
FIG. 11B is a cross-sectional view of the cell taken along a cutting-plane line XIB-XIB in FIG. 11A.

The cell 2c includes a signal path 5. The signal path 5 includes a control signal path 5a. The control signal path 5a is a signal path for transferring the control signal Sd to apply the control signal Sd to the infrared photodetector 12. FIG. 11A is a schematic plan view of the cell 2c with the infrared photodetector 12 in the second state S2 due to the control signal Sd being applied to the infrared photodetector 12. FIG. 11B is a cross-sectional view of the cell taken along a cutting-plane line XIB-XIB in FIG. 11A.

As illustrated in FIG. 11A and FIG. 11B, when the infrared photodetector 12 is in the second state S2, the infrared photodetector 12 deforms at, for example, a predetermined radius of curvature. The radius of curvature is determined such that at least part of the infrared photodetector 12 makes contact with the component 11f. The radius of curvature is the reciprocal of curvature.

The infrared photodetector 12 comes out of contact with the component 11f in response to stopping of application of the control signal Sd. As described above, adjusting the application of the control signal Sd allows switching between the following states: a state in which at least part of the infrared photodetector 12 is in contact with the component 11f; and a state in which the infrared photodetector 12 is out of contact with the component 11f. The state in which the infrared photodetector 12 is out of contact with the component 11f corresponds to the first state S1, and the state in which at least part of the infrared photodetector 12 is in contact with the component 11f corresponds to the second state S2. In this way, in the infrared sensor according to Embodiment 3, the switcher 20 is implemented by the infrared photodetector 12, the control signal path 5a, and the component 11f.

The infrared photodetector 12 is, for example, a thermopile infrared photodetector. As illustrated in FIG. 10B, the infrared photodetector 12 includes a first layer 12p, and a second layer 12q. The first layer 12p is made of a first material. The second layer 12q is made of a second material with a thermal expansion coefficient different from the thermal expansion coefficient of the first material. In the infrared photodetector 12, the first layer 12p and the second layer 12q are stacked. Accordingly, the infrared photodetector 12 includes a stack of at least two materials with different thermal expansion coefficients. The second material constituting the second layer 12q has electrical conductivity. The electrical resistivity of the second material is not limited to a specific value. The value of the electrical resistivity is, for example, less than or equal to 1 $\Omega$cm. The electrical resistivity of the second material is, for example, greater than or equal to $1 \times 10^{-4}$ $\Omega$cm. The difference between the thermal expansion coefficient of the first material constituting the first layer 12p, and the thermal expansion coefficient of the second material constituting the second layer 12q is not limited to a specific value. The difference is, for example, greater than or equal to $1 \times 10^{-6}$/K. The difference is, for example, less than or equal to $1 \times 10^{-4}$/K. As used herein, each of the terms electrical resistivity and thermal expansion coefficient means a value at 25° C.

The component 11f is not limited to a specific component as long as the component 11f constitutes a heat bath. In the cell 2c, the component 11f is, for example, the substrate 11.

Accordingly, as illustrated in FIG. 11A and FIG. 11B, application of the control signal Sd to the infrared photodetector 12 causes at least part of the infrared photodetector 12 to come into contact with the substrate 11. For example, at least part of the infrared photodetector 12 comes into contact with the bottom face of the recess 17.

With the infrared sensor according to Embodiment 3, unlike with the infrared sensors according to Embodiments 1 and 2, the second state S2 is achieved by applying a predetermined control signal Sd to the infrared photodetector 12 through the signal path 5 and thus deforming the infrared photodetector 12. Stopping the application of the control signal Sd to the infrared photodetector 12 causes the infrared photodetector 12 to switch to the first state S1. The method for controlling the infrared sensor according to Embodiment 3 is otherwise the same as the method for controlling the infrared sensor 1a according to Embodiment 1.

The operating principle of the infrared sensor according to Embodiment 3 is the same as the operating principle of the infrared sensor 1a according to Embodiment 1.

The infrared sensor according to Embodiment 3 can be manufactured by, for example, known methods including a thin-film forming method and a microfabrication method. Examples of the thin-film forming method include sputtering and vapor deposition. Examples of the microfabrication method include photolithography and selective etching. The infrared sensor according to Embodiment 3 can be also manufactured by the above-mentioned method used for manufacturing the infrared sensor 1a according to Embodiment 1.

Embodiment 4

Figure 12:
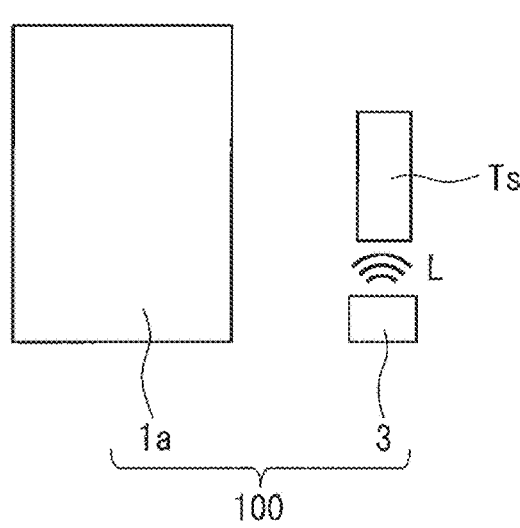
FIG. 12 schematically illustrates a sensing system according to Embodiment 4.

FIG. 12 schematically illustrates a sensing system 100 according to Embodiment 4. The sensing system 100 includes, for example, the infrared sensor 1a, and a load device 3. The load device 3 applies a load L to a sensing object Ts. The load L varies with a predetermined period. The sensing object Ts is an object to be sensed by the infrared sensor 1a. The sensing system 100 is capable of high-sensitivity infrared sensing. The sensing system 100 may include, instead of the infrared sensor 1a, the infrared sensor according to Embodiment 2 or 3.

The load L to be applied by the load device 3 to the sensing target Ts is not limited to a specific load. For example, the load device 3 applies the load L to the sensing object Ts in the form of voltage, physical load, heat, or electromagnetic radiation.

The specific frequency f, which is the reciprocal of the period of variation of the load L applied by the load device 3 to the sensing target Ts, is not limited to a specific value. From the viewpoint of improving the signal-to-noise ratio, the specific frequency f may be high. The specific frequency f is, for example, greater than or equal to 60 Hz, and may be greater than or equal to 100 Hz.

Alternative Embodiments

The infrared sensors according to the embodiments mentioned above can be changed from various viewpoints. For example, the switcher 20 may be changed to include a mechanical shutter disposed above the infrared photodetector 12. In this case, opening of the mechanical shutter causes the infrared photodetector 12 to switch from the second state S2 to the first state S1. In addition, closing of the mechanical shutter results in blocking of infrared radiation travelling toward the infrared photodetector 12, and the infrared photodetector 12 is thus switched from the first state S1 to the second state S2.

Alternative 1

Embodiment 1 may be modified as follows.

An infrared sensor including:

a pixel including a first cell including a first infrared photodetector, . . . , and an Nth cell including an Nth infrared photodetector; and a first thermoelectric cooler that cools the first infrared photodetector, . . . , and an Nth thermoelectric cooler that cools the Nth infrared photodetector, in which the first thermoelectric cooler is supplied with an electric current from a time $m \times T$ to a time $\{m \times T + ta(1)\}$, and from a time $\{m \times T + ta(1) + tb(1)\}$ to a time $(m+1) \times T$, and as a result, the first infrared photodetector is cooled, . . . , and the Nth thermoelectric cooler is supplied with an electric current from the time $m \times T$ to a time $\{m \times T + ta(N)\}$, and from a time $\{m \times T + ta(N) + tb(N)\}$ to the time $(m+1) \times T$, and as a result, the Nth infrared photodetector is cooled, in which the first thermoelectric cooler is supplied with no electric current from the time $\{m \times T + ta(1)\}$ to the time $\{m \times T + ta(1) + tb(1)\}$, . . . , and the Nth thermoelectric cooler is supplied with no electric current from the time $\{m \times T + ta(N)\}$ to the time $\{m \times T + ta(N) + tb(N)\}$, in which N is a natural number greater than or equal to 2, in which m is an integer greater than or equal to 0, in which $\{1/(N+1)\} \leq \{(ta(2) - ta(1))/T\} \leq \{1/(N-1)\}$, . . . , and $\{1/(N+1)\} \leq \{(ta(N) - ta(N-1))/T\} \leq \{1/(N-1)\}$, in which the pixel outputs a signal Om, in which the signal Om is based on one or more detection values detected by the first cell from the time $\{m \times T + ta(1)\}$ to the time $\{m \times T + ta(1) + tb(1)\}$, . . . , and the signal Om is based on one or more detection values detected by the Nth cell from the time $\{m \times T + ta(N)\}$ to the time $\{m \times T + ta(N) + tb(N)\}$, and in which the signal Om is not based on one or more detection values detected by the first cell from the time $m \times T$ to the time $\{m \times T + ta(1)\}$, and is not based on one or more detection values detected by the first cell from the time $\{m \times T + ta(1) + tb(1)\}$ to the time $(m+1) \times T$, . . . , and the signal Om is not based on one or more detection values detected by the Nth cell from the time $m \times T$ to the time $\{m \times T + ta(N)\}$, and is not based on one or more detection values detected by the Nth cell from the time $\{m \times T + ta(N) + tb(N)\}$ to the time $(m+1) \times T$.

The modification of the Embodiment 1 mentioned above is described below with reference to the drawings.

The infrared sensor (indicated at, for example, 1a in FIG. 1) includes a pixel (indicated at, for example, 10a in FIG. 1). The pixel includes a first cell including a first infrared photodetector, an ith cell including an ith infrared photodetector, and an Nth cell including an Nth infrared photodetector, where i=2 to (N−1) (the first infrared photodetector, the ith infrared photodetector, and the Nth infrared photodetector are indicated at, for example, 12a to 12d in FIG. 1, and the first cell, the ith cell, and the Nth cell are each indicated at, for example, 2a in FIG. 2).

The pixel may include a second cell including a second infrared photodetector, a third cell including a third infrared photodetector, . . . , and an (N−1)th cell including an (N−1)th infrared photodetector.

The infrared sensor includes a first thermoelectric cooler that cools the first infrared photodetector, an ith thermoelectric cooler that cools the ith infrared photodetector, and an Nth thermoelectric cooler that cools the Nth infrared photodetector. Each of the first thermoelectric cooler, the ith thermoelectric cooler, and the Nth thermoelectric cooler may be the conductive part 23. Each of the first thermoelectric cooler, the ith thermoelectric cooler, and the Nth thermoelectric cooler may be a Peltier device.

Figure 13:
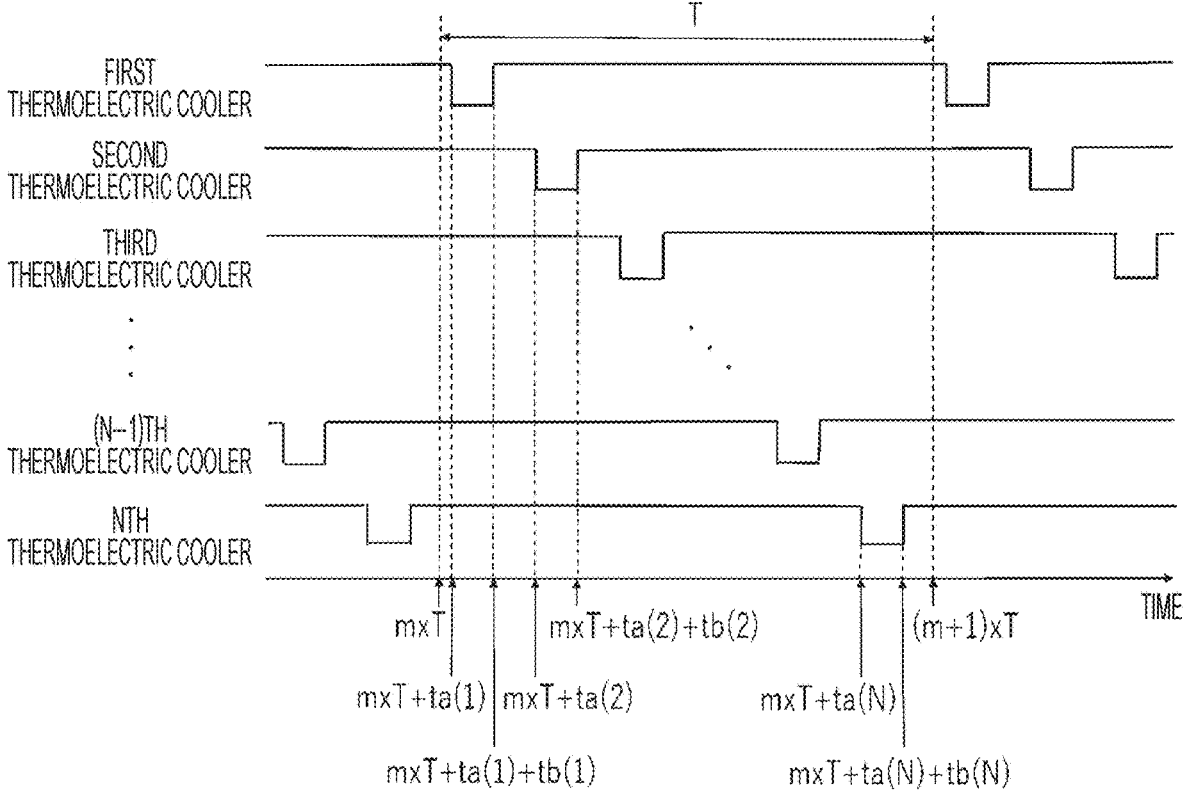
FIG. 13 illustrates how first to Nth thermoelectric coolers operate.

Referring to FIG. 13, how the first thermoelectric cooler, the ith thermoelectric cooler, and the Nth thermoelectric cooler operate is described below. FIG. 13 illustrates how the first to Nth thermoelectric coolers operate. T represents period. FIG. 13 depicts the following thermoelectric coolers each serving as the ith thermoelectric cooler: a second thermoelectric cooler, a third thermoelectric cooler, and an (N−1)th thermoelectric cooler.

A controller (not illustrated) passes an electric current through the first thermoelectric cooler by application of voltage to the first thermoelectric cooler from a time $m \times T$ to a time $\{m \times T + ta(1)\}$, and from a time $\{m \times T + ta(1) + tb(1)\}$ to a time $(m+1) \times T$. As a result, the first thermoelectric cooler absorbs heat from the first infrared photodetector, and the first infrared photodetector is cooled.

The controller passes an electric current through the ith thermoelectric cooler by application of voltage to the ith thermoelectric cooler from the time $m \times T$ to a time $\{m \times T + ta(i)\}$, and from a time $\{m \times T + ta(i) + tb(i)\}$ to the time $(m+1) \times T$. As a result, the ith thermoelectric cooler absorbs heat from the ith infrared photodetector, and the ith infrared photodetector is cooled.

The controller passes an electric current through the Nth thermoelectric cooler by application of voltage to the Nth thermoelectric cooler from the time $m \times T$ to a time $\{m \times T + ta(N)\}$, and from a time $\{m \times T + ta(N) + tb(N)\}$ to the time $(m+1) \times T$. As a result, the Nth thermoelectric cooler absorbs heat from the Nth infrared photodetector, and the Nth infrared photodetector is cooled.

The controller applies no voltage to the first thermoelectric cooler, and as a result, no electric current passes through the first thermoelectric cooler, from the time $\{m \times T + ta(1)\}$ to the time $\{m \times T + ta(1) + tb(1)\}$.

The controller applies no voltage to the ith thermoelectric cooler, and as a result, no electric current passes through the ith thermoelectric cooler, from the time $\{m \times T + ta(i)\}$ to the time $\{m \times T + ta(i) + tb(i)\}$.

The controller applies no voltage to the Nth thermoelectric cooler, and as a result, no electric current passes through the Nth thermoelectric cooler, from the time $\{m \times T + ta(N)\}$ to the time $\{m \times T + ta(N) + tb(N)\}$.

N is a natural number greater than or equal to 2, and m is an integer greater than or equal to 0.

$\{1/(N+1)\} \leq \{(ta(2) - ta(1))/T\} \leq \{1/(N-1)\}$, $\{1/(N+1)\} \leq \{(ta(j+1) - ta(j))/T\} \leq \{1/(N-1)\}$, and $\{1/(N+1)\} \leq \{(ta(N) - ta(N-1))/T\} \leq \{1/(N-1)\}$, where $j=2$ to $(N-2)$.

The signal Om is based on one or more detection values detected by the first cell from the time $\{m \times T + ta(1)\}$ to the time $\{m \times T + ta(1) + tb(1)\}$.

The signal Om is based on one or more detection values detected by the ith cell from the time $\{m \times T + ta(i)\}$ to the time $\{m \times T + ta(i) + tb(i)\}$.

The signal Om is based on one or more detection values detected by the Nth cell from the time $\{m \times T + ta(N)\}$ to the time $\{m \times T + ta(N) + tb(N)\}$.

The signal Om is not based on one or more detection values detected by the first cell from the time $m \times T$ to the time $\{m \times T + ta(1)\}$, and is not based on one or more detection values detected by the first cell from the time $\{m \times T + ta(1) + tb(1)\}$ to the time $(m+1) \times T$.

The signal Om is not based on one or more detection values detected by the ith cell from the time $m \times T$ to the time $\{m \times T + ta(i)\}$, and is not based on one or more detection values detected by the ith cell from the time $\{m \times T + ta(i) + tb(i)\}$ to the time $(m+1) \times T$.

The signal Om is not based on one or more detection values detected by the Nth cell from the time $m \times T$ to the time $\{m \times T + ta(N)\}$, and is not based on one or more detection values detected by the Nth cell from the time $\{m \times T + ta(N) + tb(N)\}$ to the time $(m+1) \times T$ (see, for example, FIG. 4).

In one example, $m \times T \leq m \times T + ta(1)$.

In one example, $m \times T + ta(1) + tb(1) \leq m \times T + ta(2)$.

In one example, $m \times T + ta(i) + tb(i) \leq m \times T + ta(i+1)$.

In one example, $m \times T + ta(N) + tb(N) \leq (m+1) \times T$.

Alternative 2

The description made above, with reference to FIG. 13, of the respective times at which the first to Nth thermoelectric coolers operate may be interpreted as a description of the respective times at which the conductive parts 23 according to Embodiments 1 to 4 mentioned above and Other Embodiments mentioned above operate.

Alternative 3

The present disclosure is not limited to Embodiments 1 to 4 mentioned above. The scope of the present disclosure also encompasses various modifications to Embodiments 1 to 4 mentioned above that may be conceived by those skilled in the art, and embodiments achieved by combining one or more constituent elements included in different embodiments and different modifications, as long as such modifications and embodiments do not depart from the spirit of the present disclosure.

The infrared sensor according to the present disclosure is applicable for various uses, including use as an infrared sensor in the related art.

What is claimed is:

1. An infrared sensor comprising:

an output pixel that includes infrared photodetectors, the output pixel generating an output signal on the basis of outputs from the infrared photodetectors, the outputs corresponding one-to-one to the infrared photodetectors; and a switcher that switches each of the infrared photodetectors between a first state and a second state independently in a predetermined period, the first state being a state in which the infrared photodetector is able to change in temperature in response to receiving infrared radiation, the second state being a state in which the infrared photodetector is maintained at a predetermined temperature, wherein each of the infrared photodetectors is maintained in the first state for a specific amount of time in the predetermined period, wherein the infrared photodetectors are switched from the second state to the first state sequentially in the predetermined period, the switches from the second state to the first state corresponding one-to-one to the infrared photodetectors, a time interval provided between a first switch among the switches and a second switch among the switches being a predetermined time interval, the second switch being provided immediately after the first switch among the switches, wherein the infrared photodetectors are switched from the first state to the second state sequentially in the predetermined period, wherein a total number of the infrared photodetectors is N, wherein N is an integer greater than or equal to 2, and wherein the predetermined time interval divided by the predetermined period is greater than or equal to $1/(N+1)$ and less than or equal to $1/(N-1)$.

2. The infrared sensor according to claim 1, wherein the specific amount of time divided by the predetermined period is greater than or equal to $0.5/N$ and less than or equal to $2/N$.

3. The infrared sensor according to claim 1, wherein in the generating the output signal, the outputs from the infrared photodetectors include an output from an infrared photodetector of the infrared photodetectors that is in the second state is regarded as zero.

4. The infrared sensor according to claim 1, wherein the output pixel includes a square number of the infrared photodetectors disposed adjacent to each other.

5. The infrared sensor according to claim 1, wherein the predetermined period is less than a thermal relaxation time of each of the infrared photodetectors, the thermal relaxation time being a time required for a temperature of the infrared photodetector to stabilize to a steady state after end of reception of infrared radiation.

6. The infrared sensor according to claim 1, further comprising:

a first wiring line through which a signal from each of the infrared photodetectors is to be transferred; and a second wiring line independent from the first wiring line, the second wiring line being a wiring line through which a control signal for the switcher is to be transferred.

7. The infrared sensor according to claim 1, further comprising a component constituting a heat bath, wherein each of the infrared photodetectors includes a stack of at least two materials with different thermal expansion coefficients, and wherein in switching from the first state to the second state, each of the infrared photodetectors deforms in response to application of a control signal, and at least part of the infrared photodetector comes into contact with the component, the control signal having an electric current value greater than or equal to a predetermined value.

8. A sensing system comprising:

the infrared sensor according to claim 1; and a load device that applies a load to an object to be sensed by the infrared sensor, the load being a load that varies with the predetermined period.

9. An infrared sensing method comprising:

generating an output signal from an output pixel on the basis of outputs from infrared photodetectors, the output pixel including infrared photodetectors, the outputs corresponding one-to-one to the infrared photodetectors;

switching each of the infrared photodetectors between a first state and a second state independently in a predetermined period, the first state being a state in which the infrared photodetector is able to change in temperature in response to receiving infrared radiation, the second state being a state in which the infrared photodetector is maintained at a predetermined temperature;

maintaining each of the infrared photodetectors in the first state for a specific amount of time in the predetermined period;

switching the infrared photodetectors from the second state to the first state sequentially in the predetermined period, the switches from the second state to the first state corresponding one-to-one to the infrared photodetectors, a time interval provided between a first switch among the switches and a second switch among the switches being a predetermined time interval, the second switch being provided immediately after the first switch among the switches; and switching the infrared photodetectors from the first state to the second state sequentially in the predetermined period, wherein a total number of the photodetectors is N, wherein N is an integer greater than or equal to 2, wherein the predetermined time interval divided by the period is greater than or equal to $1/(N+1)$ and less than or equal to $1/(N-1)$.

10. The infrared sensing method according to claim 9, comprising applying a load to an object to be sensed, the load being a load that varies with the predetermined period.

11. An infrared sensor comprising:

a pixel including a first cell including a first infrared photodetector, . . . , and an Nth cell including an Nth infrared photodetector; and a first thermoelectric cooler that cools the first infrared photodetector, . . . , and an Nth thermoelectric cooler that cools the Nth infrared photodetector, wherein the first thermoelectric cooler is supplied with an electric current from a time $m \times T$ to a time $\{m \times T + ta(1)\}$, and from a time $\{m \times T + ta(1) + tb(1)\}$ to a time $(m+1) \times T$, and as a result, the first infrared photodetector is cooled, . . . , and the Nth thermoelectric cooler is supplied with an electric current from the time $m \times T$ to a time $\{m \times T + ta(N)\}$, and from a time $\{m \times T + ta(N) + tb(N)\}$ to the time $(m+1) \times T$, and as a result, the Nth infrared photodetector is cooled, wherein the first thermoelectric cooler is supplied with no electric current from the time $\{m \times T + ta(1)\}$ to the time $\{m \times T + ta(1) + tb(1)\}$, . . . , and the Nth thermoelectric cooler is supplied with no electric current from the time $\{m \times T + ta(N)\}$ to the time $\{m \times T + ta(N) + tb(N)\}$, wherein N is a natural number greater than or equal to 2, wherein m is an integer greater than or equal to 0, wherein $\{1/(N+1)\} \le \{(ta(2) - ta(1))/T\} \le \{1/(N-1)\}$, . . . , and $\{1/(N+1)\} \le \{(ta(N) - ta(N-1))/T\} \le \{1/(N-1)\}$, wherein the pixel outputs a signal Om, wherein the signal Om is based on one or more detection values detected by the first cell from the time $\{m \times T + ta(1)\}$ to the time $\{m \times T + ta(1) + tb(1)\}$, . . . , and the signal Om is based on one or more detection values detected by the Nth cell from the time $\{m \times T + ta(N)\}$ to the time $\{m \times T + ta(N) + tb(N)\}$, and wherein the signal Om is not based on one or more detection values detected by the first cell from the time $m \times T$ to the time $\{m \times T + ta(1)\}$, and is not based on one or more detection values detected by the first cell from the time $\{m \times T + ta(1) + tb(1)\}$ to the time $(m+1) \times T$, . . . , and the signal Om is not based on one or more detection values detected by the Nth cell from the time $m \times T$ to the time $\{m \times T + ta(N)\}$, and is not based on one or more detection values detected by the Nth cell from the time $\{m \times T + ta(N) + tb(N)\}$ to the time $(m+1) \times T$.

12. The infrared sensing method according to claim 9, wherein in the generating the output signal, the outputs from the infrared photodetectors include an output from an infrared photodetector of the infrared photodetectors that is in the second state is regarded as zero.

* * * * *